(12) United States Patent
Kain

(10) Patent No.: US 10,819,382 B2
(45) Date of Patent: Oct. 27, 2020

(54) TRANSCEIVER CIRCUIT

(71) Applicant: Infineon Technologies AG, Neubiberg (DE)

(72) Inventor: Clemens Kain, Kammern (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 86 days.

(21) Appl. No.: 15/791,103

(22) Filed: Oct. 23, 2017

(65) Prior Publication Data
US 2019/0123777 A1  Apr. 25, 2019

(51) Int. Cl.
H04B 1/40 (2015.01)
H03K 5/24 (2006.01)
H03K 17/687 (2006.01)

(52) U.S. Cl.
CPC ............... H04B 1/40 (2013.01); H03K 5/24 (2013.01); H03K 17/687 (2013.01)

(58) Field of Classification Search
CPC combination set(s) only.
See application file for complete search history.

(56) References Cited

U.S. PATENT DOCUMENTS

| 2004/0000924 A1* | 1/2004 | Best | G06F 13/4072 326/30 |
| 2010/0117682 A1* | 5/2010 | Al-Shyoukh | H03K 3/35613 326/80 |
| 2014/0015592 A1* | 1/2014 | Weis | H03K 17/102 327/430 |
| 2014/0091637 A1* | 4/2014 | Endo | H02J 17/00 307/104 |
| 2014/0184328 A1* | 7/2014 | Binet | H03F 3/2171 330/251 |
| 2015/0311894 A1* | 10/2015 | McIntosh | H03K 17/6871 318/504 |
| 2016/0248340 A1* | 8/2016 | Deboy | H02M 7/217 |
| 2018/0159424 A1* | 6/2018 | Kolar | H02M 1/36 |

FOREIGN PATENT DOCUMENTS

| CN | 103986493 A | 8/2014 |
| CN | 106104958 A | 11/2016 |
| JP | 5896564 B2 | 3/2016 |
| JP | 2017169268 A | 9/2017 |

* cited by examiner

*Primary Examiner* — Junpeng Chen
(74) *Attorney, Agent, or Firm* — Slater Matsil, LLP

(57) ABSTRACT

A transceiver circuit includes a first port and second port configured to be coupled to a first and second transmission channel, respectively; a supply port configured to receive a supply voltage; a first transceiver and a second transceiver having signal ports connected to the first port and second port, respectively; and a control circuit coupled to the first and second transceivers. Each of the first and second transceivers is connected to the supply port. At least one of the first and second transceivers includes a first half-bridge and a second half-bridge connected to the supply port and to the signal port at least one of the first and second transceivers, and a transceiver output circuit configured to generate a transceiver output signal based on a voltages across a low-side switches of the first and second half-bridges.

27 Claims, 11 Drawing Sheets

US 10,819,382 B2

TRANSCEIVER CIRCUIT

TECHNICAL FIELD

This disclosure relates in general to a transceiver circuit, in particular, a transceiver circuit for receiving and transmitting differential signals.

BACKGROUND

One way of transmitting data in an environment that is subject to interferences is transmitting data in a differential fashion. In this type of communication, a sender maps information to be transmitted on complementary signals, wherein a first signal is transmitted over a first signal line of a transmission channel and a second signal is transmitted over a second signal line of the transmission channel. A receiver coupled to both signal lines demodulates signals received on the first signal line of the transmission channel and the second signal line of the transmission channel in order to retrieve the information sent by the sender. Demodulating the signals includes subtracting a signal received over the first signal line of the transmission channel from a signal received over the second signal line of the transmission channel, which makes this type of communication robust against common mode interferences that affect both signal lines in the same way.

SUMMARY

One example relates to a transceiver circuit. The transceiver circuit includes a first port configured to be coupled to a first transmission channel, a second port configured to be coupled to a second transmission channel, a supply port configured to receive a supply voltage, a first transceiver having a signal port connected to the first port, a second transceiver having a signal port connected to the second port, and a control circuit coupled to the first transceiver and the second transceiver. Each of the first transceiver and the second transceiver is connected to the supply port. Further, at least one of the first transceiver and the second transceiver includes a first half-bridge connected to the supply port and coupled to a first signal node of the signal port of the at least one of the first transceiver and the second transceiver, a second half-bridge connected to the supply port and coupled to a second signal node of the signal port of the at least one of the first transceiver and the second transceiver, and a transceiver output circuit configured to generate a transceiver output signal based on a voltage across a low-side switch of the first half-bridge and a voltage across a low-side switch of the second half-bridge.

Another example relates to a transceiver. The transceiver includes a first half-bridge connected between supply nodes and coupled to a first signal node, a second half-bridge connected between the supply nodes and coupled to a second signal node, and a transceiver output circuit configured to generate a transceiver output signal based on a voltage across a low-side switch of the first half-bridge and a voltage across a low-side switch of the second half-bridge.

Yet another example relates to a method. The method includes receiving or transmitting data by a transceiver at a signal port based on a control signal. Receiving data includes switching on a low-side switch and switching off a high-side switch of a first half-bridge connected between supply nodes of the transceiver and coupled to a first signal node of the transceiver, switching on a low-side switch and switching off a high-side switch of a second half-bridge connected between the supply nodes and coupled to a second signal node of the transceiver, and generating a transceiver output signal based on a voltage across the low-side switch of the first half-bridge and a voltage across the low-side switch of the second half-bridge.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference numerals denote like features.

Figure 1:
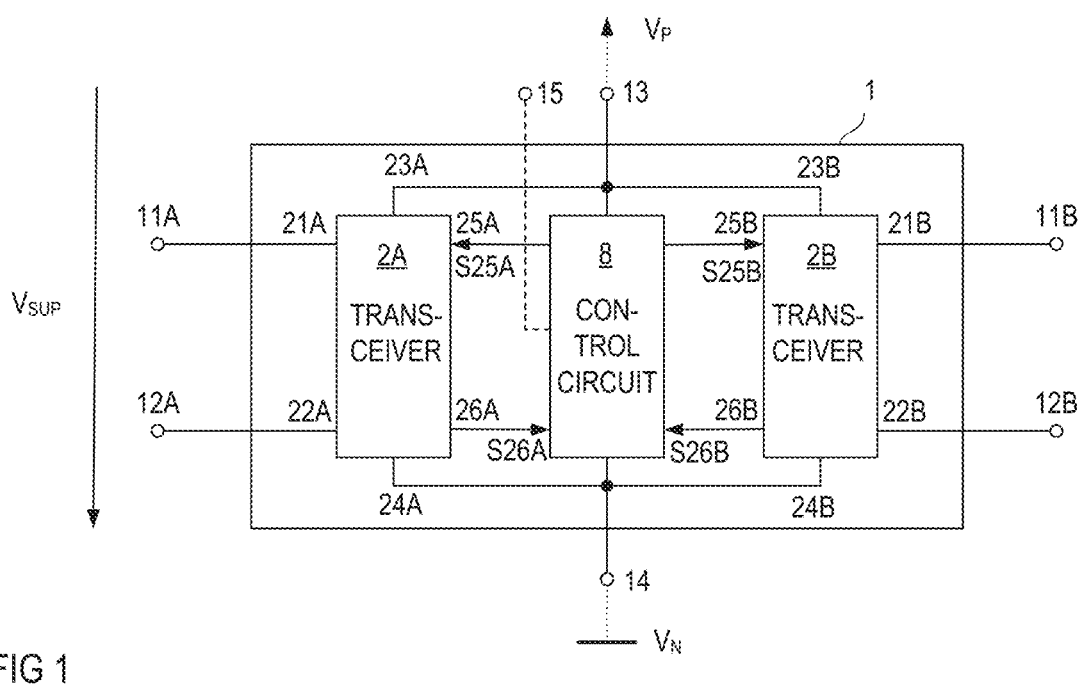
FIG. 1 shows a transceiver circuit with a first transceiver and a second transceiver according to one example.
Figure 10:
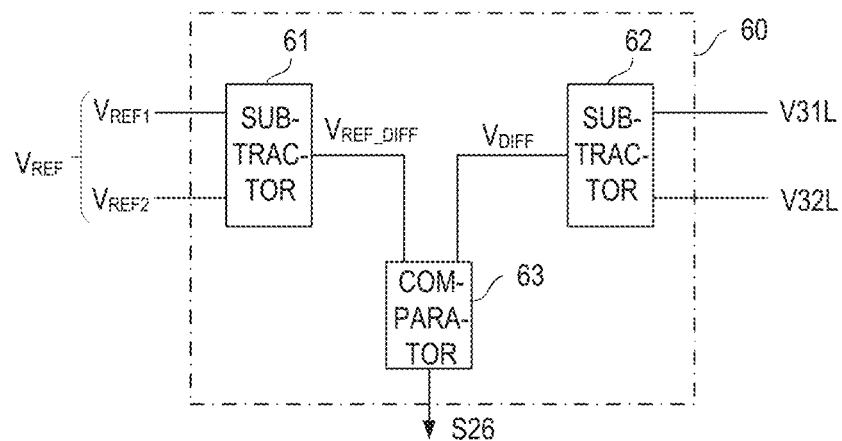
FIG. 10 shows, in greater detail, one example of a transceiver output circuit shown in FIG. 4.
Figure 12:
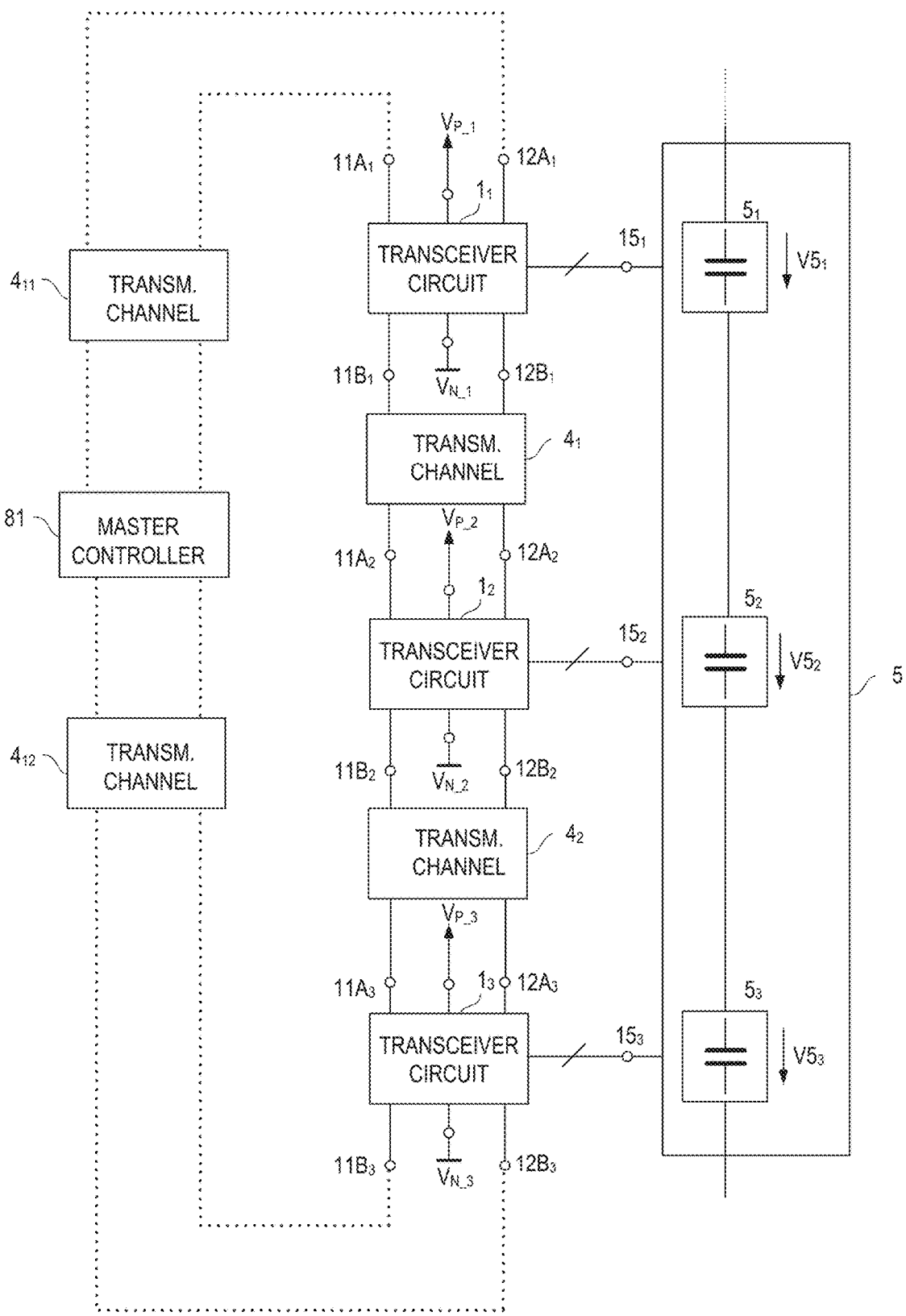
Figure 13:
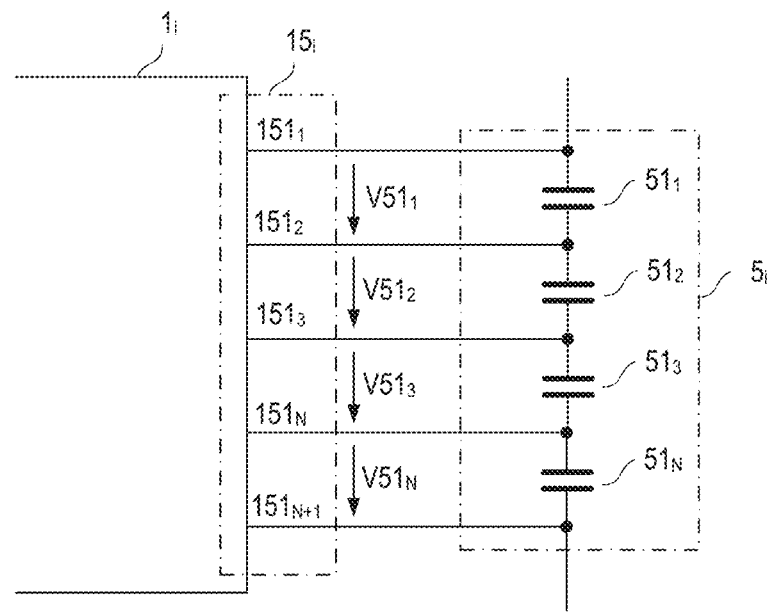
Figure 14A:
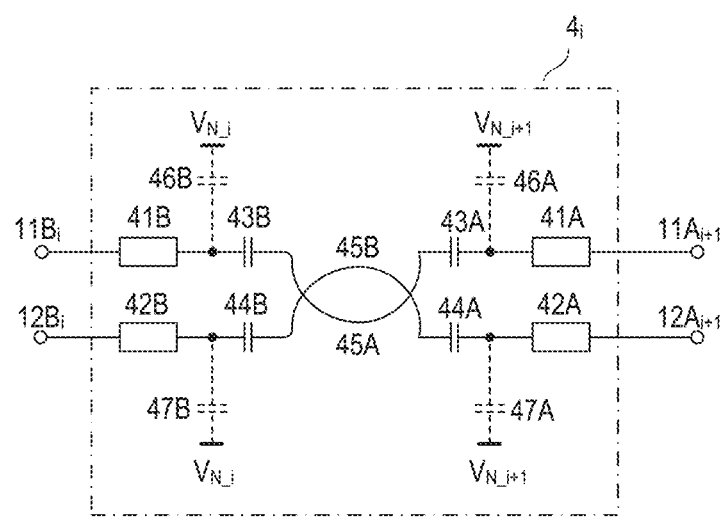
Figure 14B:
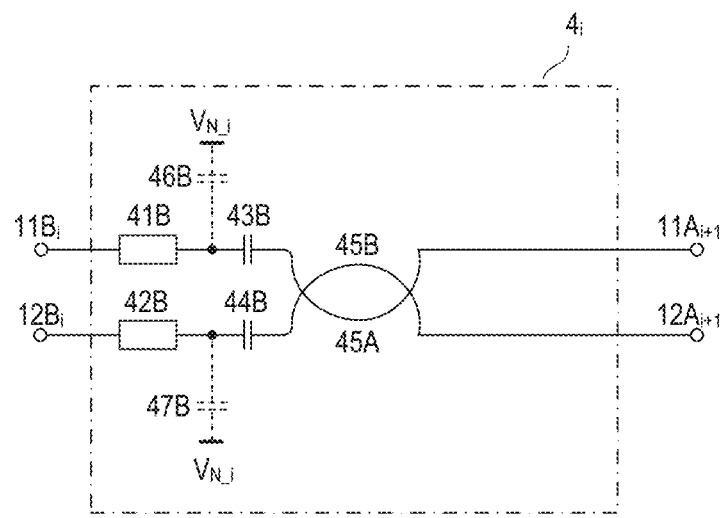
Figure 14C:
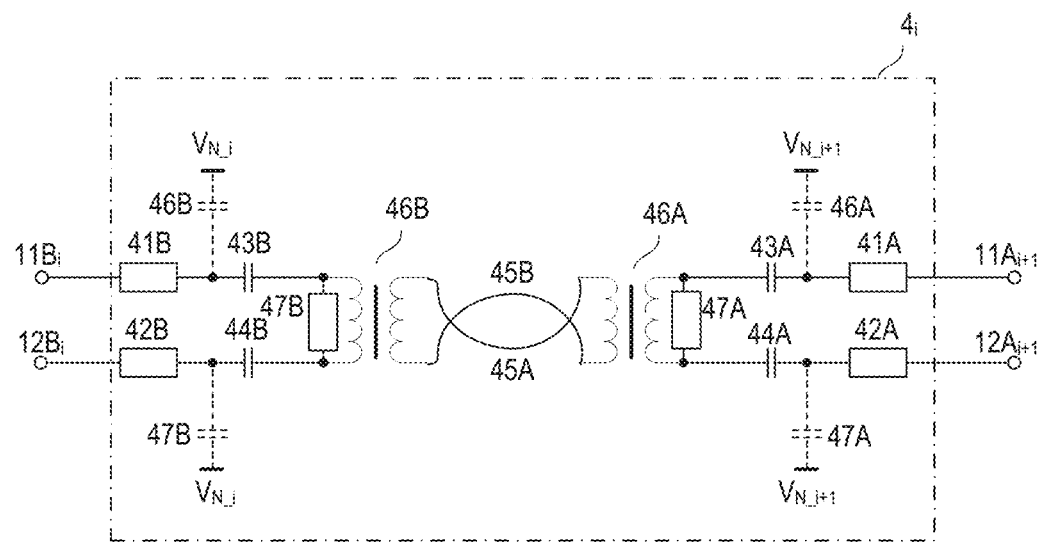
Figure 14D:
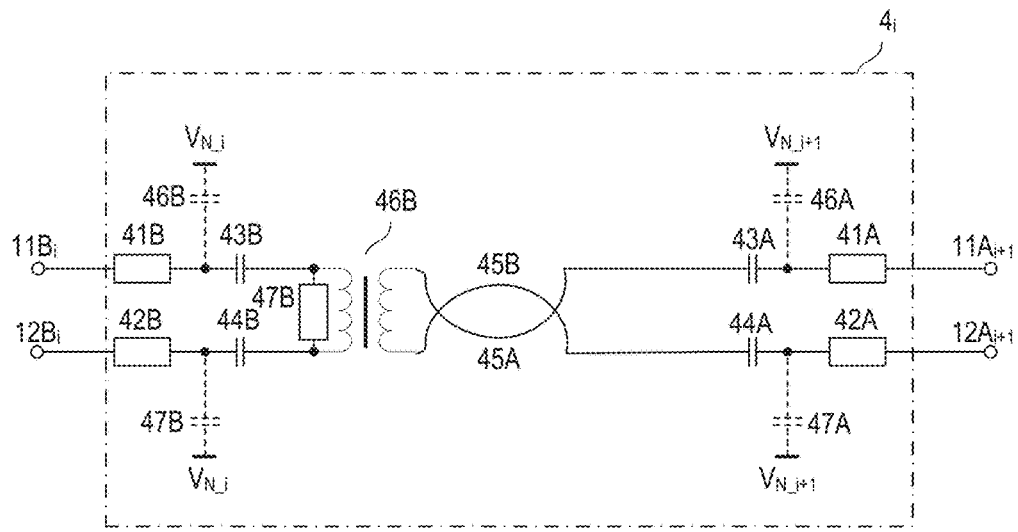
Figure 15:
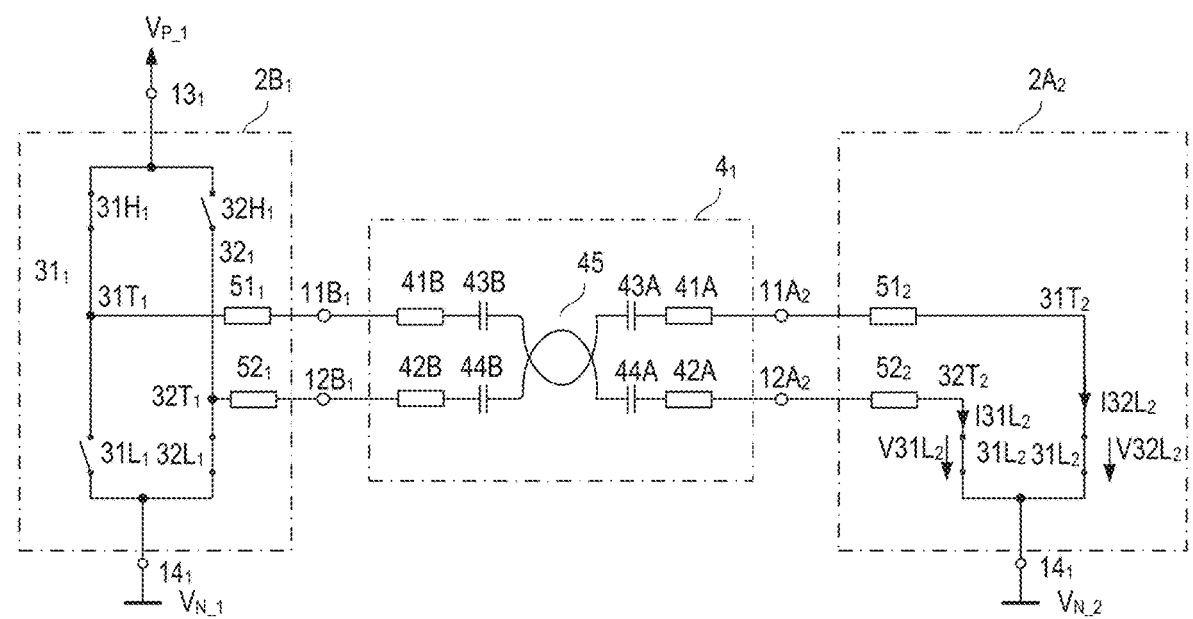
Figure 16:
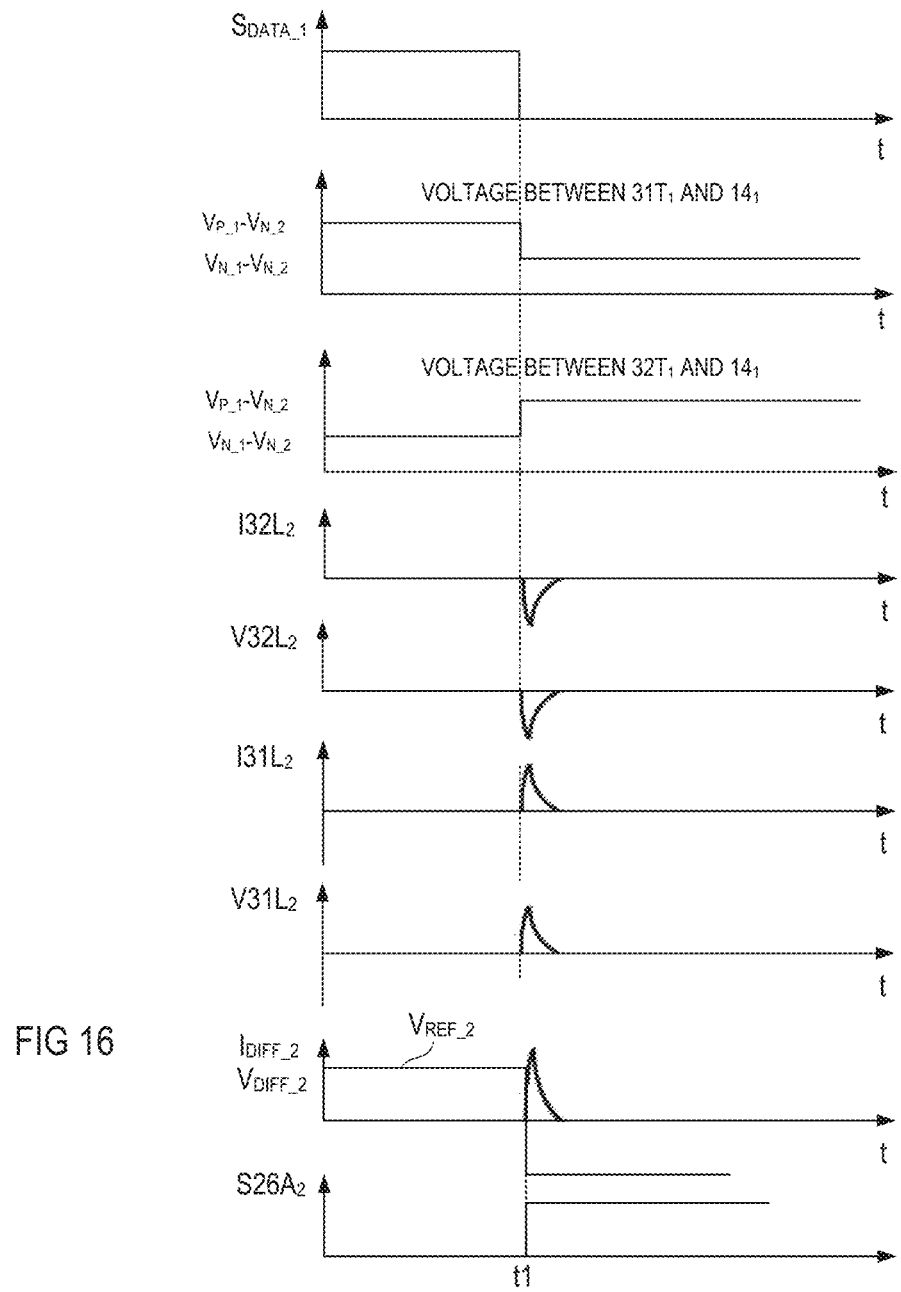

FIG. ii shows signal waveforms that illustrate an operation of the transceiver output circuit shown in FIG. 10;

FIG. 12 illustrates one example of an electronic circuit with several transceiver circuits;

FIG. 13 shows one example of a data port and a battery block coupled to the data port;

FIGS. 14A, 14B, 14C and 14D show different examples of a transmission channel configured to couple two transceiver circuits of the type shown in FIG. 1;

FIG. 15 shows active parts of a transceiver of a first transceiver circuit and active parts of a transceiver of a second transceiver circuit during a signal transmission from the first transceiver circuit to the second transceiver circuit; and FIG. 16 shows signal waveforms that illustrate the signal transmission from the first transceiver circuit to the second transceiver circuit in the example shown in FIG. 14.

DETAILED DESCRIPTION OF ILLUSTRATIVE EMBODIMENTS

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

FIG. 1 shows a block diagram of a transceiver circuit 1 according to one example. More specifically, FIG. 1 shows a block diagram of a differential transceiver circuit 1 configured to transmit and receive differential signals. Referring to FIG. 1, the transceiver circuit 1 includes a first port 11A, 12A configured to be coupled to a first transmission channel and a second port 11B, 12B configured to be coupled to a second transmission channel. Each of the first port 11A, 12A and the second port 11B, 12B is configured to be coupled to a transmission channel that includes a two-wire line so that each of the first port 11A, 12A and the second port 11B, 12B includes a first node 11A, 11B and a second node 12A, 12B. The transceiver circuit 1 further includes a supply port 13, 14 configured to receive a supply voltage $V_{SUP}$. The supply port 13, 14 include a first supply node 13 configured to receive a first supply potential $V_P$ and a second supply node 14 configured to receive a second supply potential $V_N$. The supply voltage $V_{SUP}$ is the difference between the first supply potential $V_P$ and the second supply potential $V_N$, that is, $V_{SUP}=V_P-V_N$.

Referring to FIG. 1, the transceiver circuit 1 further includes two transceivers 2A, 2B, a first transceiver 2A and a second transceiver 2B. Each of the first transceiver 2A and the second transceiver 2B includes a signal port 21A, 22A and 21B, 22B. The signal port 21A, 22A of the first transceiver 2A is connected to the first port 11A, 12A of the transceiver circuit 1, and the signal port 21B, 22B of the second transceiver 2B is connected to the second port 11B, 12B of the transceiver circuit 1. Each signal port 21A, 22A and 21B, 22B includes a first signal node 21A, 21B and a second signal node 22A, 22B. The first signal node 21A of the first transceiver 2A is connected to the first node 11A of the first port 11A, 12A, the second signal node 22A of the first transceiver 2A is connected to the second node 12A of the first port 11A, 12A, the first signal node 21B of the second transceiver 2B is connected to the first node 11B of the second port 11B, 12B, and the second signal node 22B of the second transceiver 2B is connected to the second node 12B of the second port 11B, 12B. Each of the first transceiver 2A and the second transceiver 2B is connected to the supply nodes 13, 14 in that each of the first transceiver 2A and the second transceiver 2B has a first supply node 23A, 23B connected to the first supply node 13 of the transceiver circuit 1 and a second supply node 24A, 24B connected to the second supply node 14 of the transceiver circuit 1.

Referring to FIG. 1, the transceiver circuit 1 further includes a control circuit 8 coupled to both the first transceiver 2A and the second transceiver 2B. In the example shown in FIG. 1, each of the first transceiver 2A and the second transceiver 2B includes an input 25A, 25B coupled to the control circuit 8 and configured to receive at least one input signal S25A, S25B from the control circuit 8. Further, each of the first transceiver 2A and the second transceiver 2B includes an output 26A, 26B coupled to the control circuit 8 and configured to provide at least one output signal S26A, S26B to the control circuit 8. The control circuit 8 controls operation of the two transceivers 2A, 2B. More specifically, the input signals S25A, S25B generated by the control circuit 8 and received by the transceivers 2A, 2B control operation of the transceivers 2A, 2B.

According to one example, each transceiver 2A, 2B is configured to operate in one of at least two different operating modes. According to one example, the at least two operating modes include a transmitting mode and a receiving mode. In the transmitting mode, the respective transceiver 2A, 2B outputs a data signal that includes information included in the input signal S25A, S25B via its port 11A, 12A, 11B, 12B. In the receiving mode, the respective transceiver 2A, 2B receives a data signal including information at its port 11A, 12A, 11B, 12B and generates the output signal S26A, S26B received by the control circuit 8 based on the received information. Examples of a data signal, an input signal S25A, S25B and an output signal S26A, S26B are explained herein further below. The transceiver circuit may operate in one of three different operating modes as follows:

(1) In a first operating mode, the first transceiver 2A is in the receiving mode and the second transceiver 2B is in the transmitting mode. In this operating mode, the first transceiver 2A receives a data signal at the first port 11A, 12A and maps the information included in the data signal to its output signal S26A. The control circuit 8 receives the output signal S26A and maps the information to the input signal S25B received by the second transceiver 2B. The second transceiver 2B generates and outputs at the second port 11B, 12B a data signal based on the information included in the input signal S25B. In this first operating mode, the transceiver circuit 1 passes through information received at the first port 11A, 12A to the second port.

(2) In a second operating mode, the first transceiver 2A is in the transmitting mode and the second transceiver 2B is in the receiving mode. In this second operating mode, the transceiver circuit 1 operates similar to the first operating mode, but receives a data signal at the second port 11B, 12B and outputs a data signal at the first port 11A, 12A so that the transceiver circuit 1 passes through information received at the second port 11B, 12B to the first port 11A, 12A.

(3) In a third operating mode, the control circuit 8 receives a data signal at an optional data port 15 and at least one of the two transceivers 2A, 2B operates in the transmitting mode. In this operating mode, the control circuit 8 maps information included in the data signal to the input signal S25A, S25 received by the at least one transceiver 2A, 2B operating in the transmitting mode, and the at least one transceiver 2A, 2B operating in the transmitting mode outputs a data signal including this information at its port. In the third operating mode, only one of the transceivers 2A, 2B or both transceivers 2A, 2B may operate in the transmitting mode.

Figure 2:
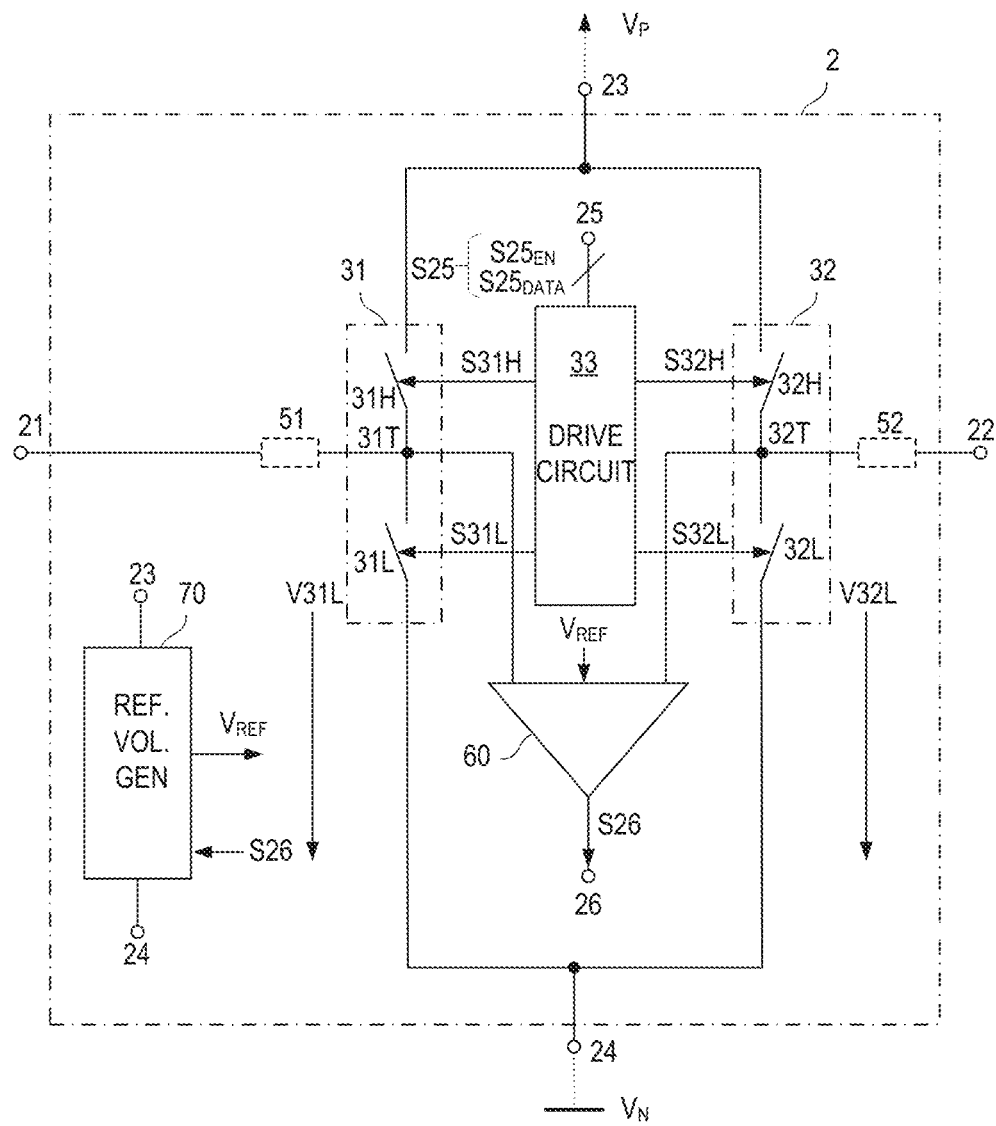
FIG. 2 shows one exemplary embodiment of at least one of the first and second transceivers.

FIG. 2 shows one example of at least one of the first transceiver 2A and the second transceiver 2B. According to one example, both the first transceiver 2A and the second transceiver 2B are implemented in accordance with the example shown in FIG. 2. In FIG. 2, reference numeral 2 denotes any one of the two transceivers 2A, 2B, reference numerals 23, 24 denotes the supply nodes of the transceiver 2, reference numerals 21, 22 denote the first signal node and the second signal node of the transceiver 2, respectively, reference numeral 25 denotes the input, reference numeral S25 denotes the input signal, reference numeral 26 denotes the output, and reference numeral S26 denotes the output signal.

Referring to FIG. 2, the transceiver 2 includes two half-bridges 31, 32, a first half-bridge 31 and a second half-bridge 32. Each of the two half-bridges 31, 32 is connected between the supply nodes 23, 24. Further, the first half-bridge 31 is coupled to the first signal node 21 of the signal port 21, 22 and the second half-bridge 32 is coupled to the second signal node 22 of the signal port 21, 22. The first half-bridge 31 includes a high-side switch 31H and a low-side switch 31L. The high-side switch 31H and the low-side switch 31L are connected in series between the first supply node 23 and the second supply node 24. A circuit node common to the high-side switch 31H and the low-side switch 31L forms a tap 31T of the first half-bridge 31. This tap 31T is connected to the first signal node 21. Optionally, a first resister 51 is connected between the tap 31T and the first signal node 21.

The second half-bridge 32 includes a high-side switch 32H and a low-side switch 32L connected in series between the first supply node 23 and the second supply node 24. A tap 32T is formed by a signal node common to the high-side switch 32H and the low-side switch 32L and is connected to the second signal node 22. Optionally, a second resistor 52 is connected between the tap 32T of the second half-bridge 32 and the second signal node 22.

Referring to FIG. 2, the transceiver 2 further includes a drive circuit 33 configured to drive the first half-bridge 31 and the second half-bridge 32 based on the input signal S25. "To drive the first half-bridge 31 and the second half-bridge 32" includes to drive the high-side switch 31H, 32H and the low-side switch 31L, 32L of each of the first and second half-bridge 31, 32. Referring to FIG. 2, the drive circuit 33 generates a first high-side drive signal S31H that drives the high-side switch 31H of the first half-bridge 31, a second high-side drive signal S32H that drives the high-side switch 32H of the second half-bridge 32, a first low-side drive signal S31L that drives the low-side switch 31L of the first half-bridge 31, and a second low-side drive signal S32L that drives the low-side switch 32L of the second half-bridge 32. Referring to FIG. 2, the input signal S25 received by the drive circuit 33 may include at least two sub-signals, a first sub-signal $S25_{EN}$, which is also referred to as enable signal in the following, and a second sub-signal $S25_{DATA}$, which is also referred to as data signal in the following. The drive circuit 33 is configured to drive the first half-bridge 31 and the second half-bridge 32 based on the input signal S25. More specifically, the drive circuit 33 is configured to generate the high-side drive signals S31H, S32H and the low-side drive signals S31L, S32L based on the input signal S25. Examples of how the drive circuit 33 may generate these drive signals S31H-S32L based on the input signal S25 are explained in detail herein further below.

Referring to FIG. 2, the transceiver 2 further includes a transceiver output circuit 60 that generates the output signal S26. The transceiver output circuit 60 is configured to generate the output signal S26 based on a voltage V31L across the low-side switch 31L of the first half-bridge 31 and a voltage V32L across the low-side switch 32L of the second half-bridge 32 and based on a reference signal $V_{REF}$ received by the transceiver output circuit 60 from a reference voltage generator 70.

Referring to the above, the transceiver 2 is configured to operate in one of at least two operating modes, a transmitting mode and a receiving mode. In the transmitting mode, the transceiver 2 transmits information via the first and second signal nodes 21, 22, and in the receiving mode, the transceiver 2 receives information via the first and second signal nodes 21, 22. Operating the transceiver 2 in the receiving mode, is explained with reference to FIGS. 3 and 4 herein below, and operating the transceiver 2 in the transmitting mode is explained with reference to FIGS. 5 and 6 herein below.

Figure 3:
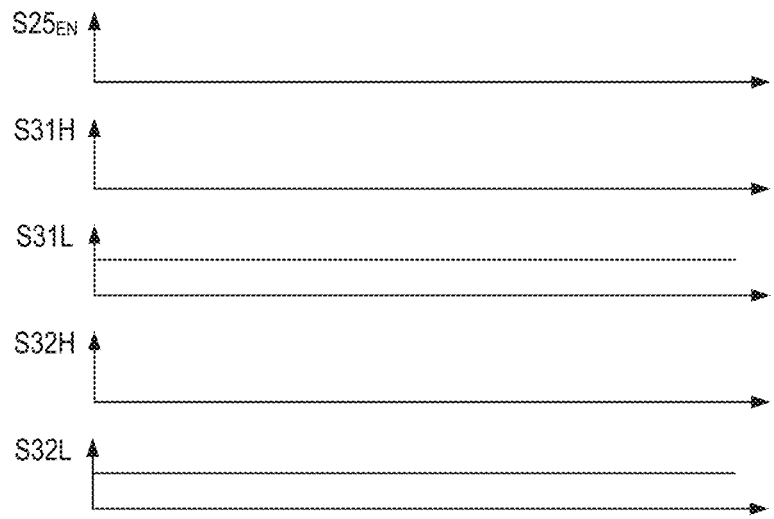
FIG. 3 shows signal waveforms that illustrate an operation of the transceiver according to the exemplary embodiment shown in FIG. 2 in a receiving mode.

In the receiving mode, the drive circuit 33 switches on the low-side switches 31L, 32L of the first half-bridge 31 and the second half-bridge 32 and switches off the high-side switches 31H, 32H. This is illustrated in FIG. 3 that shows timing diagrams of the high-side drive signals S31H, S32H and the low-side drive signals S31L, S32L. Each of these high-side drive signals S31H, S32H and low-side drive signals S31L, S32L can have an on-level that switches on the respective switch and an off-level that switches off the respective switch. Just for the purpose of illustration, the on-level is a high signal level and the off-level is a low signal level in the example shown in FIG. 3. Referring to FIG. 3, in the receiving mode, the low-side drive signals S31L, S32L are generated by the drive circuit 33 to have an on-level so as to switch on the low-side switches 31L, 32L, and the high-side drive signals S31H, S32H are generated by the drive circuit 33 to have an off-level so as to switch off the high-side switches S31H, S32H. According to one example, the transceiver 2 operates in the receiving mode or the transmitting mode based on the enable signal $S25_{EN}$. According to one example, the enable signal $S25_{EN}$ can have a transmitting mode level that causes the transceiver 2 to operate in the transmitting mode, or a receiving mode level that causes the transceiver 2 to operate in the receiving mode. FIG. 3 also shows a signal waveform of the enable signal $S25_{EN}$ which, in the receiving mode, has the receiving mode level. Just for the purpose of illustration, the receiving mode level is a low signal level in this example.

Figure 4:
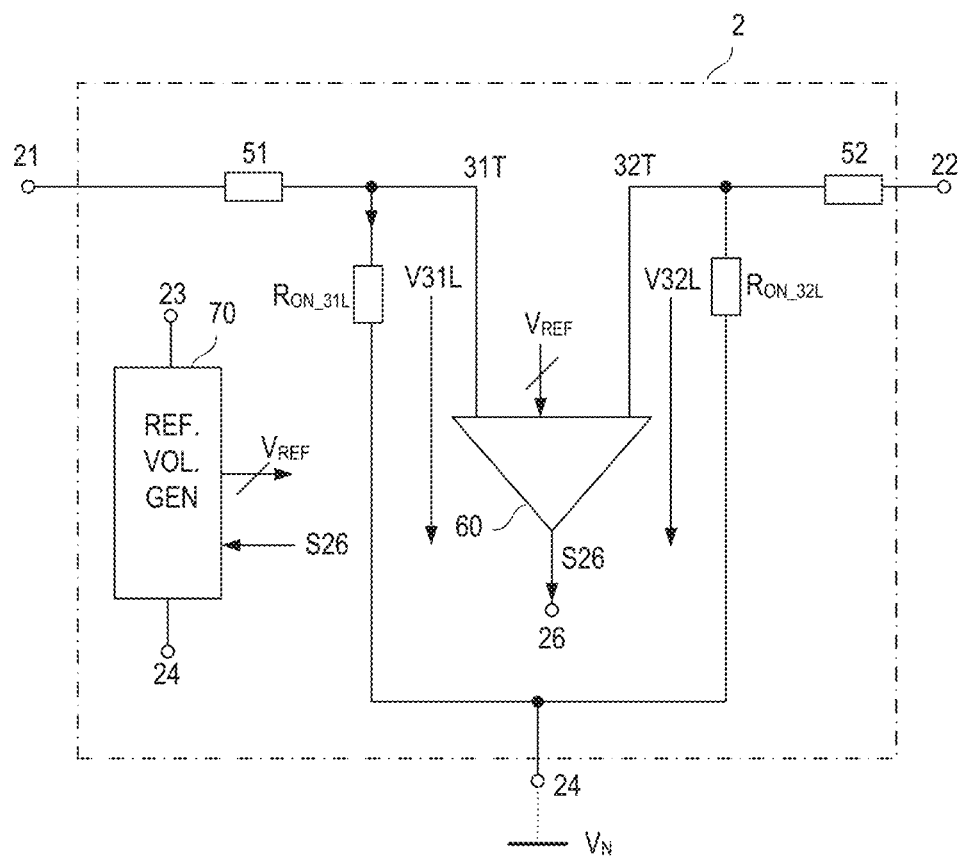
FIG. 4 illustrates which parts of the transceiver are active in the receiving mode.

FIG. 4 illustrates those pails of the transceiver 2 that are active when the transceiver 2 is in the receiving mode. In this operating mode, high-side switches (see 31H, 32H in FIG. 2) are in the off-state, so that these high-side switches are not shown in FIG. 4. Referring to the above, the low-side switches (see 31L, 32L in FIG. 2) are permanently in the on-state. These low-side switches are represented by resistors $R_{ON\_31L}$ and $R_{ON\_32L}$ in FIG. 4, wherein these resistors $R_{ON\_31L}$, $R_{ON\_32L}$ represent the on-resistances of the low-side switches 31L, 32L. The "on-resistances" are the electrical resistances of the low-side switches 31L, 32L in the on-state. The drive circuit, which, in the receiving mode, permanently switches on the low-side switches 31L, 32L, is not shown in FIG. 4.

Figure 5:
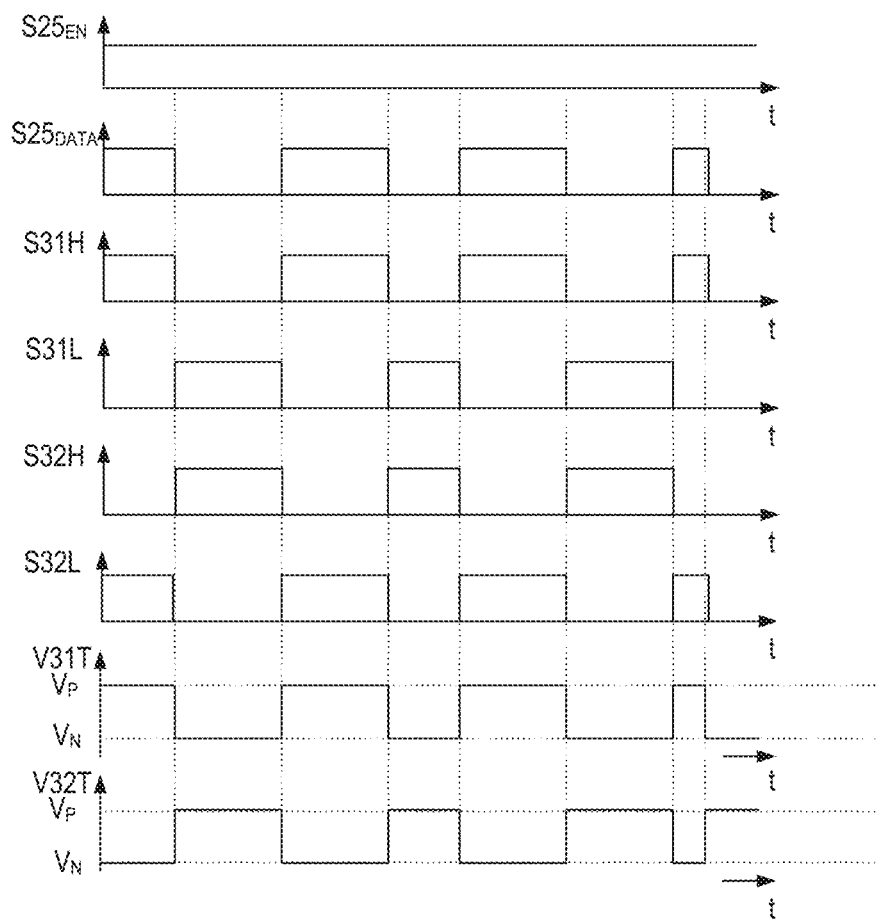
FIG. 5 shows signal waveforms that illustrate an operation of the transceiver according to the exemplary embodiment shown in FIG. 2 in a transmitting mode.

FIG. 5 shows signal waveforms of the high-side drive signals S31H, S32H, the low-side drive signals S31L, S32L, the enable signal $S25_{EN}$ and the data signal $S25_{DATA}$ in the transmitting mode of the transceiver. In the transmitting mode, the enable signal $S25_{EN}$ has a transmitting mode level. Just for the purpose of illustration, the transmitting mode level is a high signal level in the example shown in FIG. 5. In the transmitting mode, the drive circuit 33 drives the half-bridges 31, 32 dependent on the data signal $S25_{DATA}$. According to one example, the data signal $S25_{DATA}$ can have two signal levels, which are referred to as first level and second level in the following. The drive circuit 33 drives the half-bridges 31, 32 such that each of these signal levels is associated with a certain switching state of the first half-bridge 31 and a certain switching state of the second half-bridge 32. The "switching state" of the half-bridges 31, 32 is given by the switching states of the high-side switch 31H, 32H and the low-side switch 31L, 32L of the respective half-bridge. According to one example, each of the first half-bridge 31 and the second half-bridge 32 can have a first state and a second state. In the first state, the high-side switch S31H, S32H of the respective half-bridge 31, 32 is in the on-state and the low-side switch S31L, S32L is in the off-state. In the second state, the high-side switch S31H, S32H of the respective half-bridge 31, 32 is in the off-state, and the low-side switch S31L, S32L is in the on-state. According to one example, the half-bridges 31, 32 may also be operated in a third state in which both, the high-side switch 31H, 32H and the low-side switch 31L, 32L of the respective half-bridge 31, 32 is in the off-state.

Referring to FIG. 5, the drive circuit 33 may drive the first and second half-bridge 31, 32 in a complementary fashion based on the data signal $S25_{DATA}$. That is, the drive circuit 33 operates the first half-bridge 31 in the first state and the second half-bridge 32 in the second state when the data signal $S25_{DATA}$ has the first signal level, and operates the first half-bridge 31 in the second state and the second half-bridge 32 in the first state when the data signal $S25_{DATA}$ has the second level. In FIG. 5, the first signal level of the data signal $S25_{DATA}$ is a high signal level and the second signal level is a low signal level. Further a high signal level of a drive signal S31H-S32L represent an on-state of the respective switch 31H-32L and a low signal level represents an off-state. Referring to FIG. 5, the drive circuit 33 may generate the drive signals S31H-S32L such that the half-bridges 31, 32 change their switching states when the signal level of the data signal $S25_{DATA}$ changes. Optionally (not shown in FIG. 5) the drive circuit 33 may operate the half-bridges 31, 32 such that they do not directly change from the first state to the second state and from the second state to the first state, but from each of the first state and the second state change to the third state and from the third state to the second or first state. Thus, each time the signal level of the data signal $S25_{DATA}$ changes there is a time period when both switches of the half-bridges 31, 32 are in the off-state. By this, cross currents in the half-bridges 31, 32 are avoided. Such third switching states, however, are not illustrated in the signal waveforms shown in FIG. 5.

Summarizing what is illustrated in FIG. 5, the drive circuit 33 operates the half-bridges 31, 32 in a complementary fashion. Further, the high-side switch 31H, 32H and the low-side switch 31L, 32L in each half-bridge are operated in a complementary fashion. That is, at one time only one of the high-side switch 31H, 32H and the low-side switch 31L, 32L is in the on-state and the other one of the high-side switch 31H, 32H and the low-side switch 31L, 32L is in the off-state (wherein there may be time periods, which may also be referred to as dead times, in which both, the high-side switch 31H, 32H and the low-side switch 31L, 32L is in the off-state).

Figure 6:
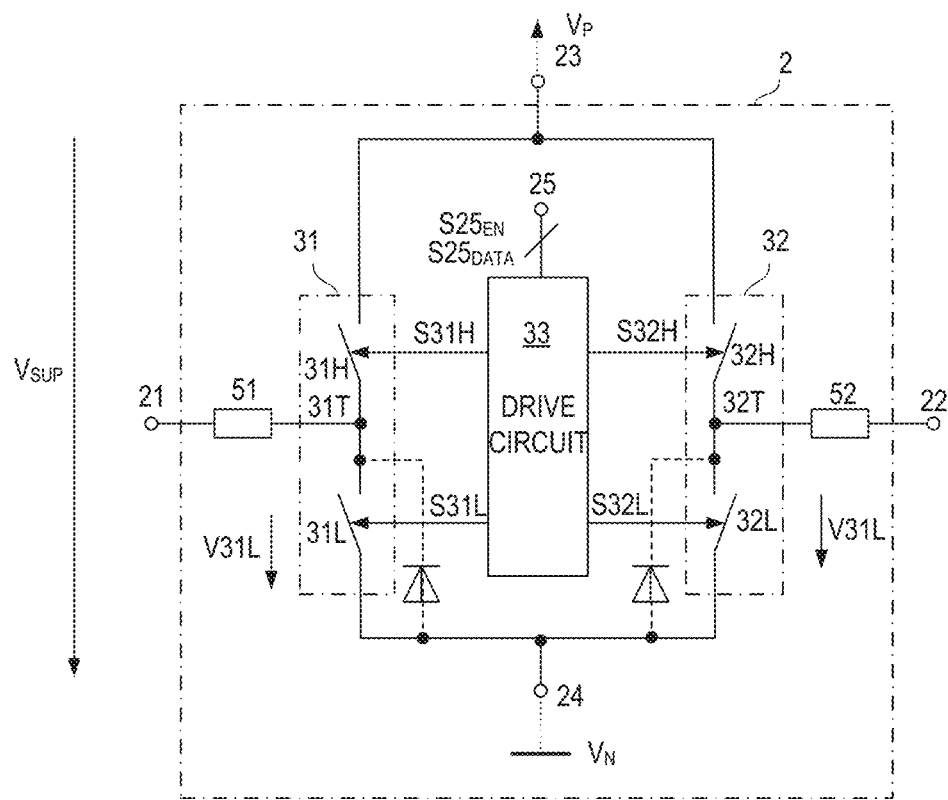
FIG. 6 illustrates which pails of the transceiver are active in the transmitting mode.

FIG. 6 illustrates those parts of the transceiver 2 that are active when the transceiver 2 is in the transmitting mode. These active parts include the half-bridges 31, 32 and the drive circuit 33. The transceiver output circuit (see 60 in FIG. 2) is not active in the transmitting mode.

Referring to FIG. 5, the data signal $S25_{DATA}$ may include a pulse pattern with first signal pulses having a first signal level (which is a high level in this example) and second signal pulses having a second signal level (which is a low level in this example). The pulse pattern includes information, wherein the information may be mapped to the pulse pattern in various conventional ways such as pulse-width modulation (PWM), pulse code modulation (PCM), pulse frequency modulation (PFM), or the like. Referring to the above, the data signal $S_{DATA}$ defines the switching states of the first and second half-bridge 31, 32 of the transceiver. The switching state of the half-bridges 31, 32, on the other hand, defines the electrical potentials at the taps 31, 32 coupled to the first signal node 21 and the second signal node 22, respectively. If, for example, the data signal $S_{DATA}$ has a first signal level so that the first half-bridge 31 is in the first state and the second half-bridge 32 is in the second state, the electrical potential at the first tap 31T substantially equals the first supply potential $V_P$ and the electrical potential at the second tap 32T substantially equals the second supply potential $V_N$. When the signal level of the data signal $S_{DATA}$ changes from the first level to the second level, the first half-bridge 31 changes from the first state to the second state (either directly or via the third state) and the second half-bridge changes to the first state to the second state (either directly or via the third state), so that the electrical potential at the first tap 31T changes from the first supply potential $V_P$ to the second supply potential $V_N$ and the electrical potential at the second tap changes from the second supply potential $V_N$ to the first supply potential $V_P$. Equivalently, when the signal level of the data signal $S_{DATA}$ changes from the second signal level to the first signal level, the electrical potential at the first tap 31T changes from the second supply potential $V_N$ to the first supply potential $V_P$ and the electrical potential at the second tap 32T changes from the first supply potential $V_P$ to the second supply potential $V_N$. This is also illustrated in FIG. 5 where V31T and V32T denote the electrical potentials at the first and second taps 31T, 32T dependent on the data signal $S_{DATA}$. Thus, each time the signal level of the data signal $S_{DATA}$ changes opposite changes of the electrical potential occur at the first and second tap 31T, 32T and, therefore, at the first and second signal node 21, 22. In particular those changes of the electrical potential may be detected by another transmitter operating in the receiving mode and coupled to the first and second signal nodes 21, 22. This is explained in greater detail below with reference to FIGS. 14 and 15.

Figure 7A:
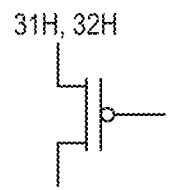
FIGS. 7A and 7B show exemplary embodiments of high-side switches and low-side switches in the transceiver.
Figure 7B:
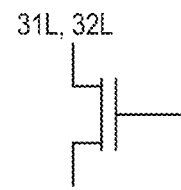

In the figures explained herein before, the high-side switches 31H, 32H and the low-side switches 31L, 32L of the half-bridges 31, 32 are simply illustrated as switches. These switches may be implemented using any type of electronic switches such as transistors. Transistors that may be used as electronic switches include, but are not restricted to MOSFETs (Metal Oxide Semiconductor Field-Effect Transistors), IGBTs (Insulated Gate Bipolar Transistors), JFETs (Junction Field-Effect Transistors), BJTs (Bipolar Junction Transistors), HEMTs (High Electron Mobility Transistors), or the like. According to one example, the high-side switch 31H, 32H and the low-side switch 31L, 32L of one half-bridge 31, 32 are implemented using complementary transistors. For example, as illustrated in FIGS. 7A and 7B, the high-side switches 31H, 32H are p-type MOSFETs and the low-side switches 31L, 32L are n-type MOSFETs.

Figure 8:
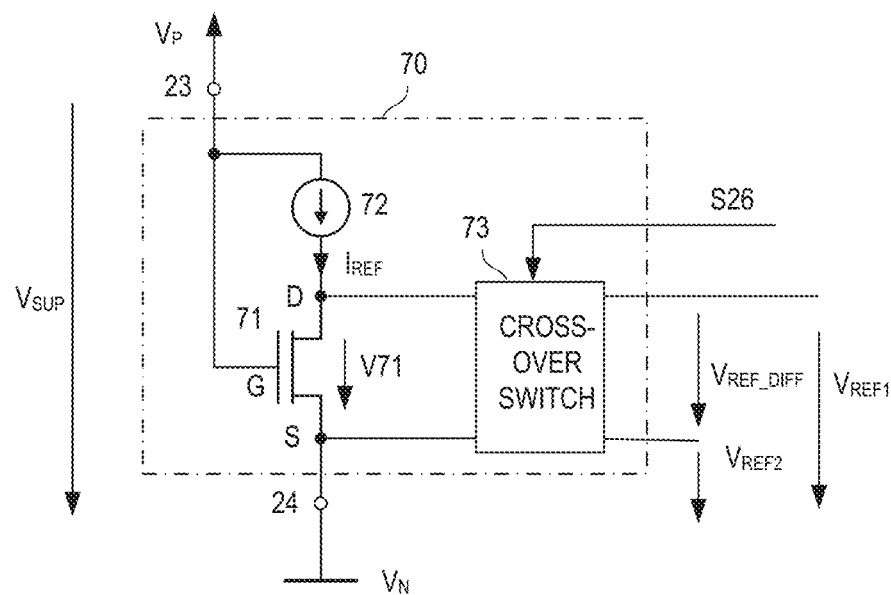
FIG. 8 shows, in greater detail, one example of a reference signal generator shown in FIG. 4.

FIG. 8 shows one example of the reference signal generator 70 shown in FIG. 2. In this example, the reference signal generator 70 is configured to generate the reference signal $V_{REF}$ to include two sub-signals, a first reference signal $V_{REF1}$ and a second reference signal $V_{REF2}$. In this example, the first and second reference signals $V_{REF1}$, $V_{REF2}$ are voltages which are referenced to the electrical potential $V_N$ at the second supply node 24. In the example shown in FIG. 8, the reference signal generator 70 includes a transistor 71 and a reference current source 72, wherein a load path of the transistor 71 and the reference current source 72 are connected in series between the first supply node 23 and the second supply node 24 of the transceiver. Just for the purpose of illustration, the transistor 71 is drawn as a MOSFET in the example shown in FIG. 8. The load path of this MOSFET is a path between a drain node D and a source node S of the MOSFET 71, so that the drain-source path D-S is connected in series with reference current source 72 in this example. A control node of the transistor, which is a gate node G when the transistor 71 is implemented as a MOSFET, is connected such that the transistor 71 switches on when the transceiver receives a supply voltage $V_{SUP}$ between the first supply node 23 and the second supply node 24. In the example shown in FIG. 8, the MOSFET 71 is an n-type MOSFET and the gate node G is connected to the first supply node 23 where the (positive) first supply potential $V_P$ is available. In this example, the transistor 71 switches on as soon as the supply voltage $V_{SUP}$ is higher than the threshold voltage of the transistor 71. The reference current source 72 generates a reference current $I_{REF}$. In the on-state of the transistor device 71, this reference current $I_{REF}$ causes a voltage drop V71 across the load path (drain-source path D-S) of the transistor 71, wherein this voltage V71 is given by the reference current $I_{REF}$ multiplied with an on-resistance $R_{ON\_71}$ of the transistor 71, wherein the on-resistance is the electrical resistance of the transistor 71 in the on-state, so that $V71=I_{REF} \cdot R_{ON\_71}$.

Referring to FIG. 8, the reference signal generator 70 further includes a crossover switch 73 that receives the output signal S26 and generates the first and second reference signals $V_{REF1}$, $V_{REF2}$ based on the transistor voltage V71 and dependent on the output signal S26. According to one example, the crossover switch 73 is configured to generate the first and second reference signals $V_{REF1}$, $V_{REF2}$ such that the first reference signal $V_{REF1}$ equals the transistor voltage V71 ($V_{REF1}$=V71) and the second reference signal $V_{REF2}$ is zero ($V_{REF2}$=0) when the output signal S26 has a first signal level and such that the first reference signal $V_{REF1}$ is zero ($V_{REF1}$=0) and the second reference signal $V_{REF2}$ equals the transistor voltage V71 ($V_{REF2}$=V71) when the output signal S26 has a second signal level.

Figure 9:
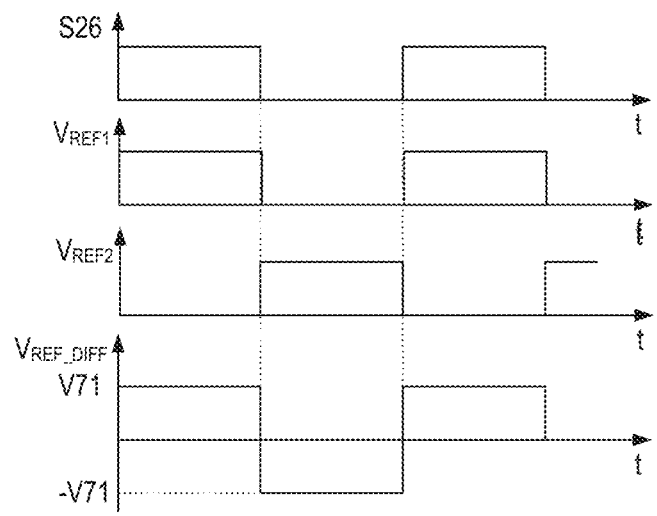
FIG. 9 shows signal waveforms that illustrate an operation of the reference signal generator shown in FIG. 8.

FIG. 10 shows one example of the transceiver output circuit 60 configured to generate the output signal S26 based on a first reference signal $V_{REF1}$ and a second reference signal $V_{REF2}$ of the type shown in FIG. 9. Referring to FIG. 10, the transceiver output circuit 60 includes a first subtractor 61 that receives the first and second reference signals $V_{REF1}$, $V_{REF2}$ and outputs a difference reference signal $V_{REF\_DIFF}$ based on these first and second reference signals $V_{REF1}$, $V_{REF2}$. According to one example, the difference reference signal $V_{REF\_DIFF}$ represents a difference of the first and second reference signals $V_{REF1}$, $V_{REF2}$, that is, $V_{REF\_DIFF}=V_{REF1}-V_{REF2}$. A signal waveform of this difference reference signal $V_{REF\_DIFF}$ is also illustrated in FIG. 9. A second subtractor 62 receives the voltages V31L, V32L across the low-side switches 31L, 32L of the half-bridges 31, 32 and calculates a difference voltage $V_{DIFF}$ such that the difference voltage $V_{DIFF}$ represents a difference between the voltage across the low-side switch of one of the first and second half-bridges 31, 32 and the voltage across the low-side switch of the other one of the first and second half-bridges. According to one example, $V_{DIFF}$=V31L−V32L. A comparator 63 receives the difference reference signal $V_{REF\_DIFF}$ and the difference voltage $V_{DIFF}$ and generates the output signal S26 based on comparing the difference voltage $V_{DIFF}$ with the difference reference voltage $V_{REF\_DIFF}$.

Figure 11:
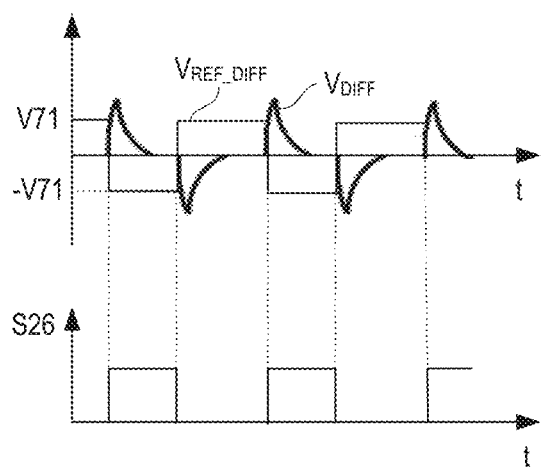

FIG. 11 shows timing diagrams of an example difference voltage $V_{DIFF}$, a corresponding difference reference voltage signal $V_{REF\_DIFF}$ and the output signal S26 in order to illustrate the function of the transceiver output circuit 60 shown in FIG. 10 and the reference voltage generator 70 shown in FIG. 8. Referring to FIG. 9, the difference reference voltage signal $V_{REF\_DIFF}$ can have two different signal levels dependent on the output signal S26, a first signal level that equals the transistor voltage V71 and a second signal level that equals the negative transistor voltage −V71. Referring to FIG. ii, the comparator 63 generates the output signal S26 such that the output signal has a first edge, which is a rising edge in the example shown in FIG. ii, when the difference voltage $V_{DIFF}$ rises above the first signal level V71 of the difference reference voltage signal $V_{REF\_DIFF}$. A second edge, which is a falling edge in the example shown in FIG. ii, of the output signal S26 occurs when the difference voltage $V_{DIFF}$ falls below the second level −V71 of the difference reference voltage signal $V_{REF\_DIFF}$, wherein the difference reference signal $V_{REF\_DIFF}$ changes its signal level in accordance with the output signal S26.

According to one example, the transistor 71 of the reference signal generator 70 and the low-side switches 31L, 32L of the first and second half-bridge 31, 32 are matched. That is, the low-side switches 31L, 32L are transistors of the same type as the transistor 71 of the reference signal generator 70, and the transistor 71 of the reference signal generator 70 and the transistors of the low-side switches 31L, 32L are selected such that there is a predefined ratio between the on-resistances $R_{ON\_31L}$, $R_{ON\_32L}$ of the on-resistances of the transistors of the low-side switches 31L, 32L and the on-resistance $R_{ON\_71}$ of the transistor 71 of the reference signal generator 70. According to one example, the on-resistances of the low-side switches 31L, 32L are at least approximately equal, so that $$\frac{R_{ON\_71}}{R_{ON\_31L}} = \frac{R_{ON\_71}}{R_{ON\_32L}} = m, \tag{1}$$

where m denotes the ratio between the on-resistance of one of the low-side switches 31L, 32L and the on-resistance of the transistor 71 of the reference signal generator 70. Referring to FIG. ii, the output signal S26 changes its signal level when the difference voltage $V_{DIFF}$ rises above V71 or when the difference voltage $V_{DIFF}$ falls below −V71. That is, the output signal S26 changes its signal level when the magnitude of the difference voltage is greater than V71, that is, $$|V_{DIFF}|>V71 \tag{2}.$$

Referring to the above, V71 can be expressed as $$V71=I_{REF} \cdot R_{ON\_71} \tag{3}.$$

Further, the magnitude of the difference voltage $V_{DIFF}$ can be expressed as $$|V_{DIFF}|=|V31-V32|=|R_{ON\_31L} \cdot I31L - R_{ON\_32L} \cdot I32L| \tag{4},$$

where I31L, referring to FIG. 4, is a current through the low-side switch 31L and I32L is a current through the low-side switch 32L when the transceiver 2 is in the receiving mode. In the following, $I_{DIFF}$ denotes a difference between these currents, that is, $$I_{DIFF}=I31L-I32L \tag{5}.$$

Further, if the on-resistances $R_{ON\_31L}$, $R_{ON\_32L}$ of the low-side switches 31L, 32L are equal, so that $R_{ON\_31L}=R_{ON\_32L}=R_{ON\_L}$, it can be shown based on equations (2)-(5) that the signal level of the output signal S26 changes when the following applies:

$$|I_{DIFF}|>m \cdot I_{REF} \tag{6}.$$

That is, the signal level of the output signal S26 changes when current pulses flow through the low-side switches 31L, 32L of the transceiver 2 in the receiving mode such that a difference between these current pulses is greater than m times the reference current $I_{REF}$.

By virtue of calculating the difference between the low-side voltages V31L, V32L the transceiver 2 has a high robustness against common-mode interferences. That is, current pulses having the same polarity and occurring at the same time do not affect generation of the output signal S26. Further, the high common-mode robustness of the transceiver 2 is based on the fact that, in the receiving mode, the low-side switches 31L, 32L provide a low-ohmic current path to the second supply node $V_N$ of the transceiver 2.

A transceiver circuit 1 of the type shown in FIG. 1 can be used in a variety of different applications in which data are to be transmitted. In particular, the transceiver circuit 1 may be used to transmit data between different voltage domains. FIG. 12 shows one example of an application in which several transceiver circuits $1_1$-$1_3$ of the type shown in FIG. 1 are employed to transmit data between different voltage domains. Just for the purpose of illustration, the electronic circuit shown in FIG. 12 includes three transceiver circuits $1_1$, $1_2$, $1_3$. These transceiver circuits $1_1$-$1_3$ are cascaded such that in each case two of the transceiver circuits are coupled by a transmission channel $4_1$, $4_2$. More specifically, in the example shown in FIG. 12, the second port $11B_1$, $12B_1$ of a first transceiver circuit 11 is coupled to the first port $11A_2$, $12A_2$ of a second transceiver circuit 12, and the second port $11B_2$, $12B_2$ of the second transceiver circuit $1_2$ is coupled to the first port $11A_3$, $12A_3$ of a second transceiver circuit $1_3$ via a second transmission channel $4_2$. It should be noted that having three transceiver circuits $1_1$-$1_3$, as shown in FIG. 12, is only an example. Any number of transceiver circuits can be cascaded in the manner illustrated in FIG. 12. According to one example (illustrated in dashed lines in FIG. 12), the cascade with the transceiver circuits $1_1$-$1_3$ is part of a ring communication structure which additionally includes a master controller 81 that is coupled to the cascade via further transmission channels $4_{11}$, $4_{12}$. A first one $4_{11}$ of these further transmission channels $4_{11}$, $4_{12}$ connects the master controller 81 to the first port $11A_1$, $12A_1$ of the first transceiver circuit $1_1$, and a second one $4_{12}$ of these transmission channels $4_{11}$, $4_{12}$ connects the master controller 81 to the second port $11B_3$, $11B_3$ of the third transceiver circuit $1_3$.

In the application shown in FIG. 12, the transceiver circuits $1_1$-$1_3$ are configured to transmit data between different voltage domains. That is, second supply potentials $V_{N\_1}$, $V_{N\_2}$, $V_{N\_3}$ of the different transceiver circuits $1_1$-$1_3$ are different in this example. Further, in this example, each of the transceiver circuits $1_1$-$1_3$ is associated with a battery block $5_1$, $5_2$, $5_3$ of a battery 5. These battery blocks $5_1$-$5_3$ are connected in series. Each of these battery blocks $5_1$-$5_3$ may include a plurality of battery cells. These battery cells may be connected in series, in parallel or arranged in any other configuration including series connections of several battery cell parallel circuits or parallel connections of several battery cell series circuits. Each of these battery blocks $5_1$-$5_3$ includes a communication interface which is not illustrated in greater detail in FIG. 12. The communication interface of each battery block $5_1$-$5_3$ is connected to the data port $15_1$-$15_3$ of the associated transceiver circuit $1_1$-$1_3$.

FIG. 13 shows one example of a data port and an associated battery block in greater detail. In FIG. 13, reference numeral $15_i$ denotes the data port of an arbitrary one of the transceivers circuits $1_1$-$1_3$ and reference numeral $5_i$ denotes the battery block coupled to the data port $15_i$. In this example, the battery block includes several battery cells $51_1$-$51_N$ connected in series, with each of these battery cells having a cell voltage $V51_1$-$V51_N$. "Battery cell" as used herein denotes a single battery cell or a group of single battery cells connected in series or connected in parallel. A voltage $V5_i$ across the battery block $5_i$ is given by the sum of the cell voltages $V51_1$-$V51_N$.

The data port $15_i$ includes a plurality of circuit nodes that are coupled to the battery cells such that the transceiver circuit $1_i$ receives at least one of the cell voltages $V51_1$-$V51_N$. The control circuit $8_i$ receives the at least one of the cell voltages $V51_1$-$V51_N$ and is configured to output information representing a voltage level of the at least one of the cell voltages $V51_1$-$V51_N$ via at least one of the first and second transceivers (not shown in FIG. 13). According to one example (as illustrated in FIG. 13), the transceiver circuit $1_i$ receives each of the cell voltages $V51_1$-$V51_N$. In this example, the data port $15_i$ may include N+1 circuit nodes each connected to a respective tap of the battery block $5_i$, wherein N is the number of battery cells. In this case, besides the cell voltages $V51_1$-$V51_N$, the transceiver circuit $5_i$ also receives the voltage $V5_i$ across the battery block $5_i$, which is the voltage between circuit nodes $15_1$ and $151_{N+1}$ in this example.

In the example shown in FIG. 13, the data port $15_i$ is an analog port configured to receive at least one analog voltage and the control circuit $8_i$ includes an analog-to-digital converter (not shown) configured to generate a digital representation of the voltage level of the at least one voltage and transmit this digital representation.

An analog data port as illustrated in FIG. 13, however, is only one example. The data ports $15_1$-$15_3$ may also be implemented as digital data ports. In this example, the loads, such as the battery blocks $5_1$-$5_3$ shown in FIG. 12, include a digital communication interface configured to generate digital representations of parameters to be transmitted to the transceiver circuits $1_1$-$1_3$. In case of battery blocks, these parameters may include, besides the cell voltages explained with reference to FIG. 13, temperatures of the battery blocks $5_1$-$5_3$ or temperatures of one or more battery cells in the battery blocks $5_1$-$5_3$.

Referring to FIG. 1, the data port 15 is connected to the control circuit 8. The control circuit 8 may transmit the information received via the data port 15 through one of the first and second transceivers 2A, 2B upon request. Such request may be received from the master controller 81. In a ring structure of the type shown in FIG. 12, transceiver circuit 12, for example, may receive information from the master controller 81 via transmission channel $82_1$, transceiver circuit $1_1$ operating in the first mode and transmission channel $4_1$ or via transmission channel $82_2$, transceiver circuit $1_3$ operating in the second mode and transmission channel $4_2$, or on both ways. According to one example, for redundancy reasons, the transceiver circuit that is requested by the master controller 81 to transmit data, transmits this data via both the first transceiver 2A and the second transceiver 2B.

According to one example, the first supply potential and the second supply potential of one transceiver circuit is defined by the associated battery block so that, for example, the supply voltage of each transceiver circuit $1_1$, $1_2$, $1_3$ corresponds to the voltage across the associated battery block $5_1$, $5_2$, $5_3$. This is illustrated in dashed lines in FIG. 12. In this case, the first supply potential of one transceiver circuit may correspond to the ground potential of another one of the transceiver circuits. In the example shown in FIG. 12, for example, ground potential $V_{N\_1}$ of the first transceiver circuit $1_1$ may correspond to the first supply potential $V_{P\_2}$ of the second transceiver circuit $1_2$.

Different types of transmission channels may be used to connect two of the transceiver circuits $1_1$-$1_3$ or to connect the master controller 81 with the transceiver circuits $1_1$, $1_3$. Different examples of how these transmission channels may be implemented are illustrated in FIGS. 14A to 14D. In these figures, reference numeral $4_i$ denotes an arbitrary one of the transmission channels $4_1$, $4_2$ shown in FIG. 12. Reference numerals $11B_i$, $12B_i$ denote the second port one transceiver circuit connected to the channel $4_i$ and reference numerals $11A_{i+1}$, $12A_{i+1}$ denote the first port of another transceiver circuit connected to the channel $4_i$.

In the example shown in FIG. 14A, the transmission channel includes two connection lines with each of these connection lines including two RC circuits. A first connection line is connected between the first node of the second port and the first node $11A_{i+1}$ of the first port, and the second connection line is connected between the second node $12B_i$ of the second port and the second node $12A_{i+1}$ of the first port. Each RC circuit includes a resistor 41A, 41B, 42A, 42B and a capacitor 43A, 43B, 44A, 44B. According to one example, resistances of the individual resistors 41A-42B are substantially equal, and capacitances of the individual capacitors 43A-44B are substantially equal. A first RC circuit of each connection line is connected to the second port $11A_{i+1}$, $12B_i$, and a second RC circuit of each connection line is connected to the first port $11A_{i+1}$, $12A_{i+1}$. The two RC circuits of each connection line are connected by a wire 45A, 45B, wherein the two wires 45A, 45B can be implemented in a twisted-pair configuration. According to one example, the resistors 41A, 41B, 42A, 42B have the same resistance and the capacitors 43A, 43B, 44A, 44B have the same capacitance.

The channel $4_i$ shown in FIG. 14A is symmetrical between the second port $11B_i$, $12B_i$ and the first port $11A_{i+1}$, $12A_{i+1}$. Implementing the channel $4_i$ to be symmetrical, however, is only an example. According to another example shown in FIG. 14B, the channel $4_i$ is not symmetrical. This channel $4_i$ is based on the channel shown in FIG. 14A and can be obtained from the channel shown in FIG. 14A by omitting one of the resistors and one of the capacitors in each line. Just for the purpose of illustration, the channel $4_i$ shown in FIG. 14B results from the channel shown in FIG. 14A by omitting resistors 41A, 42A and capacitors 43A, 44A. This, however, is only an example, any of the two resistors 41A, 41B and 42A, 42B in each line and any of the capacitors 43A, 43B and 44A, 44B in each line can be omitted.

The transmission channel $4_i$ shown in FIG. 14C is different from the transmission channel $4_i$ shown in FIG. 14A in that it additionally includes two transformers 46B, 46A and a resistor 47A, 47B connected in parallel with one winding of the respective transformer 46A, 46B. The transformers 46A, 46B include a first transformer 46B coupled between the first RC circuits 41B, 43B, 42B, 44B and the wires 45A, 45B, and a second transformer 46A coupled between the wires 45A, 45B and the second RC circuits 43A, 41A, 44A, 42A. Like the transmission channel shown in FIG. 14A the transmission channel shown in FIG. 14C is symmetrical.

FIG. 14D shows one example of a transmission channel that is based on the transmission channel shown in FIG. 14C and that is not symmetrical. This channel $4_i$ shown in FIG. 14D results from the channel shown in FIG. 14 by omitting one of the transformers and the respective resistor. In this example, transformer 46A and resistor 47A have been omitted. This, however, is only an example.

According to one example, in the circuit shown in FIG. 12, the channels $4_1$, $4_2$ between the transceiver circuits $1_1$-$1_3$ are implemented in accordance with one of FIGS. 14A and 14B, and the channels $4_{11}$, $4_{12}$ between the master controller 81 and the transceiver circuits $1_1$, $1_3$ are implemented in accordance with one of FIGS. 14C and 14D.

Referring to FIGS. 14A to 14D taps of the RC circuits may be coupled to the second supply potentials $V_{N\_i}$, $V_{N\_i+1}$ of the transceivers (not shown in FIGS. 13A and 13B) connected by the transmission channel $4_i$ via further capacitors 46A, 46B, 47A, 47B. That is, taps of the first RC circuits 41B, 43B and 42B, 44B may be coupled to the second supply potential $V_{N\_i}$ of the transceiver associated with port $11B_i$, $12B_i$ and taps of the second RC circuits 41A, 43A and 42A, 44A may be coupled to the second supply potential $V_{N\_i+1}$ of the transceiver associated with port $11A_{i+1}$, $12A_{i+1}$.

FIGS. 15 and 16 illustrate a data transmission between a first transceiver circuit 11, from which only the second transceiver $2B_1$ shown in FIG. 15, and a second transceiver circuit $1_2$ from which only the first transceiver $2A_2$ is shown in FIG. 15. In the example shown in FIG. 15, the second transceiver $2B_1$ is in the transmitting mode, and the first transceiver $2A_2$ is in the receiving mode. The second transceiver $2B_1$ is therefore referred to as transmitting receiver and the first transceiver $2A_2$ is therefore referred to as receiving transmitter in the following. Just for the purpose of illustration, a transmission channel $4_1$ coupled between the first transceiver circuit and the second transceiver circuit is implemented as illustrated in FIG. 14A. This, however, is only an example. Any other type of transmission channel may be used as well.

FIG. 16 illustrates a voltage between the tap $31T_1$ of the first half-bridge $31_1$ of the transmitting transceiver $2B_1$ and the second supply node $14_1$ of the receiving transceiver $2A_1$, a voltage between the tap $32T_1$ of the second half-bridge $32_1$ of the transmitting transceiver $2B_1$ and the second supply node $14_1$ of the receiving transceiver $2A_2$. Further, FIG. 16 shows timing diagrams of a current $I31L_2$ through the first low-side switch $31L_2$ of the first half-bridge $31L_2$ in the receiving transceiver $2A_2$ and a current $I32L_2$ through the second low-side switch $32L_2$ of the second half-bridge 32 in the receiving transceiver $2A_2$. Further, FIG. 16 shows a timing diagram of the current difference $I_{DIFF\_2}$ between these currents $I31L_2$, $I32L_2$, that is, $I_{DIFF\_2}=I31L_2-I32L_2$. In accordance with Ohm's law, voltages $V31L_2$, $V32L_2$ across the low-side switches $31L_2$, $32L_2$ of the receiving transceiver $2A_2$ are proportional to the currents $I31L_2$, $I32L_2$, and the difference voltage $V_{DIFF\_2}$ calculated by the transceiver output circuit (not shown) in the transceiver $2A_2$ is proportional to the difference current $I_{DIFF\_2}$.

In the example shown in FIG. 16, the timing diagrams begin at a time when, as illustrated in FIG. 15, in the transmitting transceiver $2B_1$ the first half-bridge $31_1$ is in the first state, that is, the high-side switch $31H_1$ is closed and the low-side switch $31L_1$ is open, and the second half-bridge $32_1$ is in the second state, that is, the high-side switch $32H_1$ is open and the low-side switch $32L_1$ is closed. A data signal $S_{DATA\_1}$ that governs the switching state of the half-bridges $31_1$, $32_1$ in the transmitting transceiver $2B_1$ is also illustrated in FIG. 16. When the second half-bridge $32_1$ is in the second state the voltage between $32T_1$ and $14_1$ is given by the difference $V_{N\_1}-V_{N\_2}$ of the second supply potentials $V_{N\_1}$, $V_{N\_2}$, and when the first half-bridge $31_1$ is in the first state the voltage between $31T_1$ and $14_1$ is given by the difference between the first supply potential $V_{P\_1}$ and the second supply potential $V_{N\_2}$.

In FIG. 16, t1 denotes a time instance, when the half-bridges $31_1$, $32_1$ of the transceiver $2B_1$ change their switching states based on the data signal $S_{DATA\_1}$ such that the first half-bridge $31_1$ enters the second state, that is, the high-side switch $31H_1$ switches off and the low-side switch $31L_1$ switches on, and the second half-bridge $32_1$ enters the first state, that is, the high-side switch $32H_1$ switches on and the low-side switch $32L_1$ switches off. This causes the voltage between $31T_1$ and $14_1$ to jump to $V_{N\_1}-V_{N\_2}$ and the voltage between $32T_1$ and $14_1$ to jump to $V_{P\_1}-V_{N\_2}$. These voltage jumps cause current pulses $I31L_2$, $I32L_2$ with opposite polarities in the low-side switches $31L_2$, $32L_2$ of the receiving transmitter $2A_2$ and, consequently, voltage pulses $V31L_2$, $V32L_2$ with opposite polarities across the low-side switches $31L_2$, $32L_2$ of the receiving transmitter $2A_2$. Peaks Ip_31, Ip_32 and durations of these current pulses $I31L_2$, $I32L_2$ are essentially defined by the RC circuits included in the transmission channel $4_1$. In general, the current peaks Ip_31, Ip_32 are defined by the difference $V_{P\_1}-V_{N\_2}$ and the electrical resistance of the respective branch, as follows:

$$\text{Ip\_31} = \frac{V_{P\_1} - V_{N\_2}}{R32\_14 + R_{ON\_32H1}} \quad (7a)$$

$$\text{Ip\_32} = \frac{V_{P\_1} - V_{N\_2}}{R31\_14 + R_{ON\_31L1}}, \quad (7b)$$

where R31_14 denotes the overall electrical resistance between circuit node $32T_1$ and circuit node $14_1$, R32_14 denotes the overall electrical resistance between circuit node $31T_1$ and circuit node $14_1$, $R_{ON\_32H1}$ denotes the on-resistance of the high-side switch $32H_1$ of the first half-bridge that switches on, and $R_{ON\_31L1}$ denotes the on-resistance of the low-side switch $31L_1$ of the first half-bridge that switches on. In the example shown in FIG. 15, the resistances R31_14, R32_14 are substantially given by:

$$R31\_14 = R51_1 + R41B + R41A + R51_2 + R_{ON\_32L2} \quad (8a)$$

$$R32\_14 = R52_1 + R42B + R42A + R52_2 + R_{ON\_31L2}, \quad (8b)$$

where R51, R41B, R41A, $R51_2$, $R52_1$, R42B, R42A, $R52_2$ denote the electrical resistances of resistors $51_1$, 41B, 41A, $51_2$, $52_1$, 42B, 42A, $52_2$, and $R_{ON\_31L2}$, $R_{ON\_32\_L2}$ denote the on-resistances of the low-side switches $31L_2$, $32L_2$ of the receiving transceiver $2A_2$. Peaks Vp_31, Vp_32 of the voltage pulses $V31L_2$, $V32L_2$ are given by $$Vp\_31 = Ip\_31 \cdot R_{ON\_31L2} \quad (9a)$$

$$Vp\_32 = Ip\_32 \cdot R_{ON\_32L2} \quad (9b),$$

and a peak of the voltage difference $V_{DIFF\_2}$ is given by the difference Vp_31-Vp_32.

Time constants τ31_14, τ32_14 of RC circuits in the branches between circuit nodes $31T_1$, $32T_1$ in the transmitting transceiver $2B_1$ and circuit node $14_1$ in the receiving transceiver $2A_2$ are given by $$\tau31\_14 = (R31\_14 + R_{ON\_31L1}) \cdot C31\_14 \quad (10a)$$

$$\tau32\_14 = (R32\_14 + R_{ON\_32H1}) \cdot C32\_14 \quad (10b),$$

where C31_14, C32_14 denote overall capacitances in the respective branches. In the example shown in FIG. 15, the overall capacitance C31_14 in the branch between circuit nodes $31T_1$ and $14_1$ is given by the capacitance of the series circuit of capacitors 43A, 43B, and the overall capacitance C32_14 in the branch between circuit nodes $32T_1$ and $14_1$ is given by the capacitance of the series circuit of capacitors 44A, 44B. According to one example, the resistors and capacitances of the RC circuits are adapted to one another such that each of the time constants τ31_14, τ32_14 is less than 20% of a reciprocal of the data rate, wherein the data rate is the frequency at which data symbols occur in the data signal (see $S25_{DATA}$ in FIG. 5).

Referring to FIG. 15, additionally to the resistors included in the transmission channel $4_1$, the optional resistors $51_1$, $52_1$, $51_2$, $52_2$ included in the transceivers $2B_1$, $2A_2$ add to the resistances of the RC circuits and, therefore, affect the time constants of the RC circuits. According to one example, these optional resistors $51_1$-$52_2$ can be omitted. Alternatively, the resistors of the transmission channel can be omitted and these resistors can be integrated in the transceivers $2B_1$, $2A_1$.

According to one example, in a circuit of the type shown in FIG. 15 the on-resistances of the high-side switches $31H_1$, $32H_1$ and the low-side switches $31L_1$, $32L_1$, $31L_2$, $32L_2$ and the resistances of the resistors $51_1$, 41A, 41B, $51_2$, $52_1$, 42A, 42B, $52_2$ are selected such that each of R31_14+$R_{ON\_31L1}$ and R32_14+$R_{ON\_32H1}$ in equations (7a), (7b), (10a), and (10b) is about 120Ω (ohms). This may be obtained by selecting R41A=R41B=R42A=R42B=39Ω and $R51_1$=$R51_2$=$R52_1$=$R52_2$=20Ω and $R_{ON\_31L}$=$R_{ON\_32H1}$=$R_{ON\_31L2}$=$R_{ON\_32L2}$=1Ω. Further, the overall capacitance of each of the branches may be about 50 pF (picofarads), which may be achieved by selecting the capacitance of each of capacitors 43A, 43B, 44A, 44B to be about 1 nF (nanofarad). In this example, each of the time constants τ31_14, τ32_14 is about 60 ns (nanoseconds). According to one example a data rate is 2 Mbit/s so that a reciprocal of the data rate (that is the duration of one symbol to be transmitted) is 50 ns (nanoseconds). In this example, the time constants are about 12% of the reciprocal of the data rate. It should be mentioned that this is only an example to illustrate what is explained with reference to equations (10a) and (10b) herein above.

Referring to FIGS. 4, 10 and 11, in the receiving mode of one transceiver 2, the respective transceiver output circuit 60 calculates a difference voltage $V_{DIFF}$ based on the voltages V31L, V32L across the low-side switches 31L, 32L, compares the difference voltage with a reference voltage and generates the output signal S26 based on this comparing. In FIG. 16, $S26A_2$ denotes the output signal of transceiver $2A_2$ that is generated in this way by a transceiver output circuit (not shown in FIG. 14). This output signal $S26A_2$ is generated by comparing the difference voltage $V_{DIFF\_2}$ with a reference voltage $V_{REF\_2}$ that toggles dependent on the output signal $S26A_2$. As can be seen from FIG. 16, the output signal $S26A_2$ of the receiving transmitter $2A_2$ is a time delayed version of the data signal $S_{DATA\_1}$ of the transmitting transceiver (wherein a time delay results from propagation delays in the transceivers $2B_1$, $2A_2$ and in the transmission channel). Thus, data (information) included in the data signal $S_{DATA\_1}$ are transmitted via the channel $4_1$ from the transmitting transceiver $2B_1$ to the receiving transceiver $2A_2$ by the circuit arrangement shown in FIG. 14.

Referring to the above, one reason that the transceiver 2 explained above is robust against common mode interferences is that in the receiving mode the low-side switches 31L, 32L are in the on-state and provide a low-ohmic current path to the ground node 24. According to one example, the low side switches 31L, 32L are selected such that their on-resistance $R_{ON\_31L}$, $R_{ON\_32L}$ is between 0.1 ohm and 3 ohm.

According to one example, the on-resistance is selected based on a maximum peak of common mode interferences that may occur. This is explained with reference to FIGS. 6, 7A and 7B in the following. Referring to FIGS. 7A and 7B, the low side switches 31L, 32L may be implemented as MOSFETs. MOSFETs usually include an internal diode, which is often referred to as body diode. In a transceiver of the type shown in FIG. 6, MOSFETs forming the low-side switches 31L, 32L are connected between the taps 31T, 32T and the second supply node such that an anode is connected to the second supply node and a cathode is connected to a respective one of the taps 31T, 32T. Those diodes integrated in low-side switches 31L, 32L implemented as MOSFETs are illustrated in dashed lines in FIG. 6. The transceiver 2 may be implemented as an integrated circuit or may be part of an integrated circuit. For different reasons it may be undesirable for the body diodes of the low side switches 31L, 32L to become forward biased such that they conduct a current. Let $V_f$ be a minimum of a forward voltage, wherein a forward voltage is a voltage that forward biases the body diodes such that they conduct a current. Usually this forward voltage decreases as the temperature increases. According to one example, $V_f$ is about 0.3V. In order to prevent these diodes from conducting a current, magnitudes of the voltages V31L, V32L across the low side switches 31L, 32L should be below $V_f$. This can be obtained by selecting the low side switches such that $R_{ON} < V_f/I_p$, where $R_{ON}$ is the on-resistance of the respective low-side switch 31L, 32L and Ip is the maximum current peak of common mode interferences that may occur.

The following examples may illustrate one or more aspects of the disclosure.

Example 1

A transceiver circuit, including: a first port configured to be coupled to a first transmission channel; a second port configured to be coupled to a second transmission channel; a supply port configured to receive a supply voltage; a first transceiver having a signal port connected to the first port; a second transceiver having a signal port connected to the second port; and a control circuit coupled to the first transceiver and the second transceiver, wherein each of the first transceiver and the second transceiver is connected to the supply port, and wherein at least one of the first transceiver and the second transceiver comprises: a first half-bridge connected to the supply port and coupled to a first signal node of the signal port of the at least one of the first transceiver and the second transceiver, a second half-bridge connected to the supply port and coupled to a second signal node of the signal port of the at least one of the first transceiver and the second transceiver, and a transceiver output circuit configured to generate a transceiver output signal based on a voltage across a low-side switch of the first half-bridge and a voltage across a low-side switch of the second half-bridge.

Example 2

The transceiver circuit of example 1, wherein the at least one of the first transceiver and the second transceiver includes both the first transceiver and the second transceiver.

Example 3

The transceiver circuit of any one of examples 1 to 2, wherein the transceiver output circuit includes a comparator configured to generate the transceiver output signal based on the voltage across the low-side switch of the first half-bridge, the voltage across the low-side switch of the second half-bridge, and a reference signal.

Example 4

The transceiver circuit of any one of examples 1 to 3, wherein the first half-bridge is coupled to the first signal node via a first resistor, and wherein the second half-bridge is coupled to the second signal node via a second resistor.

Example 5

The transceiver circuit of example 4, wherein a resistance of the first resistor is between 10 times and 30 times an on-resistance of the low-side switch of the first half-bridge, and wherein a resistance of the second resistor is between 10 times and 30 times an on-resistance of the low-side switch of the second half-bridge.

Example 6

The transceiver circuit of any one of examples 1 to 5, wherein the control circuit is configured to operate the at least one of the first transceiver and the second transceiver in one of a receiving mode and a transmitting mode.

Example 7

The transceiver circuit of example 6, wherein the at least one of the first transceiver and the second transceiver is configured to generate the transceiver output signal only in the receiving mode.

Example 8

The transceiver circuit of any one of examples 1 to 7, wherein the at least one of the first transceiver and the second transceiver further includes a drive circuit configured to drive the first half-bridge and the second half-bridge.

Example 9

The transceiver circuit of example 8, wherein the drive circuit, in the receiving mode, is configured to switch on the low-side switch of each of the first half-bridge and the second half-bridge and switch off a high-side switch of each of the first half-bridge and the second half-bridge.

Example 10

The transceiver circuit of any one of examples 8 to 9, wherein the drive circuit, in the transmitting mode, is configured to drive the first half-bridge and the second half-bridge based on a data signal received from the control circuit.

Example 11

The transceiver circuit of example 10, wherein the control circuit further includes a data input configured to receive an input signal, and wherein the control circuit is configured to generate the data signal based on the input signal.

Example 12

The transceiver circuit of any one of examples 6 to 11, wherein the control circuit is configured to change an operation of one of the first transceiver and the second transceiver from the transmitting mode to the receiving mode based on the transceiver output signal of the other one of the first transceiver and the second transceiver.

Example 13

The transceiver circuit of any one of examples 3 to 12, wherein the at least one of the first transceiver and the second transceiver further includes: a reference signal generator connected to the supply port and configured to generate the reference signal.

Example 14

The transceiver circuit of example 13, wherein the reference signal generator is configured to receive the transceiver output signal, and to generate a first signal level or a second signal level of the reference signal based on the transceiver output signal.

Example 15

The transceiver circuit of any one of examples 1 to 14, wherein the low-side switch of each of the first half-bridge and the second half-bridge is a MOSFET.

Example 16

A transceiver, including: a first half-bridge connected between supply nodes and coupled to a first signal node, a second half-bridge connected between the supply nodes and coupled to a second signal node, and a transceiver output circuit configured to generate a transceiver output signal based on a voltage across a low-side switch of the first half-bridge and a voltage across a low-side switch of the second half-bridge.

Example 17

The transceiver of example 16, wherein the first half-bridge is coupled to the first signal node via a first resistor, and wherein the second half-bridge is coupled to the second signal node via a second resistor.

Example 18

The transceiver of any one of examples 16 to 17, wherein the transceiver is configured to operate in one of a receiving mode and a transmitting mode based on a control signal received at a control input.

Example 19

The transceiver circuit of example 18, wherein the transceiver is configured to generate the transceiver output signal only in the receiving mode.

Example 20

The transceiver of any one of examples 16 to 19, further including: a drive circuit configured to drive the first half-bridge and the second half-bridge.

Example 21

The transceiver of example 20, wherein the drive circuit, in the receiving mode, is configured to switch on the low-side switch of each of the first half-bridge and the second half-bridge and switch off a high-side switch of each of the first half-bridge and the second half-bridge.

Example 22

The transceiver of any one of examples 20 to 21, wherein the drive circuit, in the transmitting mode, is configured to drive the first half-bridge and the second half-bridge based on a data signal.

Example 23

The transceiver of any one of examples 16 to 22, wherein the transceiver further includes: a reference signal generator connected to the supply nodes and configured to generate a reference signal.

Example 24

The transceiver of example 23, wherein the reference signal generator is configured to receive the transceiver output signal, and to generate a first signal level or a second signal level of the reference signal based on the transceiver output signal.

Example 25

A method, including receiving or transmitting data by a transceiver at a signal port based on a control signal, wherein receiving data includes: switching on a low-side switch and switching off a high-side switch of a first half-bridge connected between supply nodes of the transceiver and coupled to a first signal node of the transceiver, switching on a low-side switch and switching off a high-side switch of a second half-bridge connected between the supply nodes and coupled to a second signal node of the transceiver, and generating a transceiver output signal based on a voltage across the low-side switch of the first half-bridge and a voltage across the low-side switch of the second half-bridge.

Example 26

The method of example 25, wherein generating the transceiver output signal includes generating the transceiver output signal only when receiving data.

Example 27

The method of any one of examples 25 and 26, wherein transmitting data includes driving the first half-bridge and the second half-bridge based on a data signal.

Example 28

The method of any one of examples 25 to 27, wherein generating the transceiver output signal includes comparing a difference of the voltage across the low-side switch of the first half-bridge and the voltage across the low-side switch of the second half-bridge with a reference voltage.

Example 29

The method of example 28, further including: generating the reference signal to have a first signal level or a second signal level based on the transceiver output signal.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A transceiver circuit, comprising:
    a supply port configured to receive a supply voltage;
    a first transceiver and a second transceiver, wherein the first transceiver and the second transceiver each comprises
        a first half-bridge connected to the supply port and coupled to a first signal node of a signal port, and to a first half-bridge control input,
        a second half-bridge connected to the supply port and coupled to a second signal node of the signal port and to a second half-bridge control input, and
        a transceiver output circuit configured to generate a transceiver output signal based on a voltage across a low-side switch of the first half-bridge and a voltage across a low-side switch of the second half-bridge,
        wherein the signal port of the first transceiver is configured to be coupled to a first transmission channel, and the signal port of the second transceiver is configured to be coupled to a second transmission channel; and
    a control circuit coupled to the first transceiver and the second transceiver, wherein the control circuit is configured to
        cause the first half-bridge and the second half-bridge of the first transceiver to drive the first transmission channel differentially by applying a first switching signal to the first half-bridge control input of the first transceiver, and applying a second switching signal to the second half-bridge control input of the first transceiver, wherein the first switching signal and the second switching signal have opposite polarities, and
        cause the first half-bridge and the second half-bridge of the second transceiver to drive the second transmission channel differentially by applying a third switching signal to the first half-bridge control input of the second transceiver, and applying a fourth switching signal to the second half-bridge control input of the second transceiver, wherein the third switching signal and the fourth switching signal have opposite polarities.

2. The transceiver circuit of claim 1, wherein the transceiver output circuit comprises a comparator configured to generate the transceiver output signal based on the voltage across the low-side switch of the first half-bridge, the voltage across the low-side switch of the second half-bridge, and a reference signal.

3. The transceiver circuit of claim 2, wherein the at least one of the first transceiver and the second transceiver further comprises:
    a reference signal generator connected to the supply port and configured to generate the reference signal.

4. The transceiver circuit of claim 3, wherein the reference signal generator is configured
    to receive the transceiver output signal, and
    to generate a first signal level or a second signal level of the reference signal based on the transceiver output signal.

5. The transceiver circuit of claim 1,
    wherein the first half-bridge is coupled to the first signal node via a first resistor, and
    wherein the second half-bridge is coupled to the second signal node via a second resistor.

6. The transceiver circuit of claim 5,
    wherein a resistance of the first resistor is between 10 times and 30 times an on-resistance of the low-side switch of the first half-bridge, and
    wherein a resistance of the second resistor is between 10 times and 30 times an on-resistance of the low-side switch of the second half-bridge.

7. The transceiver circuit of claim 1, wherein the control circuit is configured to operate the first transceiver and the second transceiver in a receiving mode and in a transmitting mode.

8. The transceiver circuit of claim 7, wherein the first transceiver or the second transceiver is configured to generate the transceiver output signal only in the receiving mode.

9. The transceiver circuit of claim 7,
    wherein the first transceiver and the second transceiver each further comprises a drive circuit configured to drive the first half-bridge and the second half-bridge.

10. The transceiver circuit of claim 7,
    wherein the control circuit is configured to change an operation of one of the first transceiver and the second transceiver from the transmitting mode to the receiving mode based on the transceiver output signal of the other one of the first transceiver and the second transceiver.

11. The transceiver circuit of claim 9, wherein the drive circuit, in the receiving mode, is configured to switch on the low-side switch of each of the first half-bridge and the second half-bridge and switch off a high-side switch of each of the first half-bridge and the second half-bridge.

12. The transceiver circuit of claim 9, wherein the drive circuit, in the transmitting mode, is configured to drive the first half-bridge and the second half-bridge based on a data signal received from the control circuit.

13. The transceiver circuit of claim 12,
    wherein the control circuit further comprises a data input configured to receive an input signal, and
    wherein the control circuit is configured to generate the data signal based on the input signal.

14. The transceiver circuit of claim 1, wherein the low-side switch of each of the first half-bridge and the second half-bridge is a MOSFET.

15. The transceiver circuit of claim 1, wherein the first transceiver and the second transceiver each comprises:
- a differential comparator configured to compare a voltage difference between the first signal node and the second signal node to a differential reference signal; and
- a reference signal generator configured to generate the differential reference signal based on an output of the differential comparator.

16. The transceiver circuit of claim 15, wherein the reference signal generator comprises:
- a voltage generator; and
- a cross-over switch having an input coupled to an output of the voltage generator, and an output coupled to an input of the differential comparator, wherein a state of the cross-over switch depends on the output of the differential comparator.

17. The transceiver circuit of claim 1, wherein:
- the first half-bridge control input comprises a first high-side control input coupled to a control node of a high-side switch of the first half-bridge, and a first low-side control input coupled to a control node of a low-side switch of the first half-bridge; and
- the second half-bridge control input comprises a second high-side control input coupled to a control node of a high-side switch of the second half-bridge, and a second low-side control input coupled to a control node of a low-side switch of the second half-bridge.

18. A transceiver, comprising:
- a first half-bridge connected between supply nodes and coupled to a first signal node,
- a second half-bridge connected between the supply nodes and coupled to a second signal node, and
- a transceiver output circuit configured to generate a transceiver output signal based on a voltage across a low-side switch of the first half-bridge and a voltage across a low-side switch of the second half-bridge; and
- a drive circuit configured to drive the first signal node and the second signal node differentially via the first half-bridge and the second half-bridge based on a data signal by applying a first switching signal to a first half-bridge control input of the first half-bridge and applying a second switching signal to a second half-bridge control input of the second half-bridge, wherein the first switching signal and the second switching signal have opposite polarities.

19. The transceiver of claim 18,
- wherein the first half-bridge is coupled to the first signal node via a first resistor, and
- wherein the second half-bridge is coupled to the second signal node via a second resistor.

20. The transceiver of claim 18, wherein the transceiver is configured to operate in one of a receiving mode and a transmitting mode based on a control signal received at a control input.

21. The transceiver of claim 20, wherein the transceiver is configured to generate the transceiver output signal only in the receiving mode.

22. The transceiver of claim 20, wherein the drive circuit, in the receiving mode, is configured to switch on the low-side switch of each of the first half-bridge and the second half-bridge and switch off a high-side switch of each of the first half-bridge and the second half-bridge.

23. The transceiver of claim 18, wherein the transceiver further comprises:
- a reference signal generator connected to the supply nodes and configured to generate a reference signal.

24. The transceiver of claim 23, wherein the reference signal generator is configured
- to receive the transceiver output signal, and
- to generate a first signal level or a second signal level of the reference signal based on the transceiver output signal.

25. The transceiver of claim 18, wherein the transceiver output circuit comprises:
- a differential comparator configured to compare a voltage difference between the voltage across the low-side switch of the first half-bridge and the voltage across the low-side switch of the second half-bridge to a differential reference signal; and
- a reference signal generator configured to generate the differential reference signal based on an output of the differential comparator.

26. A method, comprising receiving or transmitting data by a transceiver at a signal port based on a control signal, wherein:
- receiving data comprises:
  - switching on a low-side switch and switching off a high-side switch of a first half-bridge connected between supply nodes of the transceiver and coupled to a first signal node of the transceiver,
  - switching on a low-side switch and switching off a high-side switch of a second half-bridge connected between the supply nodes and coupled to a second signal node of the transceiver, and
  - generating a transceiver output signal based on a voltage across the low-side switch of the first half-bridge and a voltage across the low-side switch of the second half-bridge; and
- transmitting data comprising driving the first signal node and the second signal node differentially via the first half-bridge and the second half-bridge, wherein driving the first signal node and the second signal node differentially comprises applying a first switching signal to a first half-bridge control input of the first half-bridge and applying a second switching signal to a second half bridge control input of the second half-bridge, wherein the first switching signal and the second switching signal have opposite polarities.

27. The method of claim 26, wherein generating the transceiver output signal comprises:
- comparing a voltage difference between the voltage across the low-side switch of the first half-bridge and the voltage across the low-side switch of the second half-bridge with a differential reference signal to produce the transceiver output signal; and
- generating the differential reference signal based on the transceiver output signal.

* * * * *